US006839887B1

(12) United States Patent
Lampaer et al.

(10) Patent No.: US 6,839,887 B1
(45) Date of Patent: Jan. 4, 2005

(54) METHOD AND SYSTEM FOR PREDICTIVE MULTI-COMPONENT CIRCUIT LAYOUT GENERATION WITH REDUCED DESIGN CYCLE

(75) Inventors: Koen Lampaer, Irvine, CA (US); Andy Brotman, Irvine, CA (US); Paolo Miliozzi, Irvine, CA (US); Paramjit Singh, Lake Forest, CA (US); Mishel Matloubian, Irvine, CA (US); Bijan Bhattacharyya, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 363 days.

(21) Appl. No.: 10/029,476

(22) Filed: Oct. 24, 2001

(51) Int. Cl.$^7$ .......................... G06F 9/455; G06F 17/50; G06F 9/45

(52) U.S. Cl. ............................ 716/11; 703/14; 716/5; 716/10; 716/12

(58) Field of Search .............................. 716/1, 2, 4, 5, 716/8, 9, 10, 11, 12, 17, 18; 703/13, 14

(56) References Cited

U.S. PATENT DOCUMENTS 5,666,288 A * 9/1997 Jones et al. .................... 716/17
6,381,563 B1 * 4/2002 O'Riordan et al. ........... 703/14

OTHER PUBLICATIONS

J.D. Conway et al., "An Automatic Layout Generator for Analog Circuits," 1992 IEEE, pp. 513–519.*
M. Dessouky et al., "Layout–Oriented Synthesis of High Performance Analog Circuits," ACM 2000, pp. 53–57.*
J.A. Prieto et al., "A Performance–Driven Placement Algorithm with Simultaneous Place&Route Optimization for Analog IC's," 1997 IEEE, pp. 389–394.*
Ferrario et al., "Moving from Mixed Signal to RF Test Hardware Development," 2001 ITC Int'l Test Conference, Paper 34.1, pp. 948–956.*
Miliozzi et al., "A Design System for RFIC: Challenges and Solutions," Proceedings of the IEEE, vol. 88, No. 10, Oct. 2000, pp. 1613–1632.*
Charbon et al., "Generalized Constraint Generation for Analog Circuit Design," 1993 IEEE/ACM Int'l Conference on CAD, pp. 408–414.*

* cited by examiner

Primary Examiner—Leigh M. Garbowski
(74) Attorney, Agent, or Firm—Farjami & Farjami LLP

(57) ABSTRACT

One embodiment discloses receiving a number of parameter values for a multi-component circuit. From the received parameter values, a number of parasitic values for various components in the multi-component circuit are determined. For example, parasitic resistor values and parasitic capacitor values for transistors in the multi-component circuit are determined. The parasitic resistor values and parasitic capacitor values are used in simulating the multi-component circuit. According to a disclosed embodiment, a layout of the multi-component circuit is then generated that results in parasitic values that are the same as the parasitic values already used in simulating the multi-component circuit. As such, the parasitic values of the multi-component circuit have already been taken into account in the initial circuit simulation and there is no need to extract the internal parasitics of the multi-component circuit for further circuit simulations.

34 Claims, 10 Drawing Sheets

Fig. 2   Differential Pair
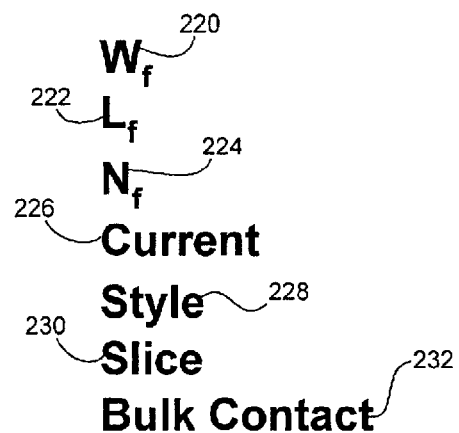
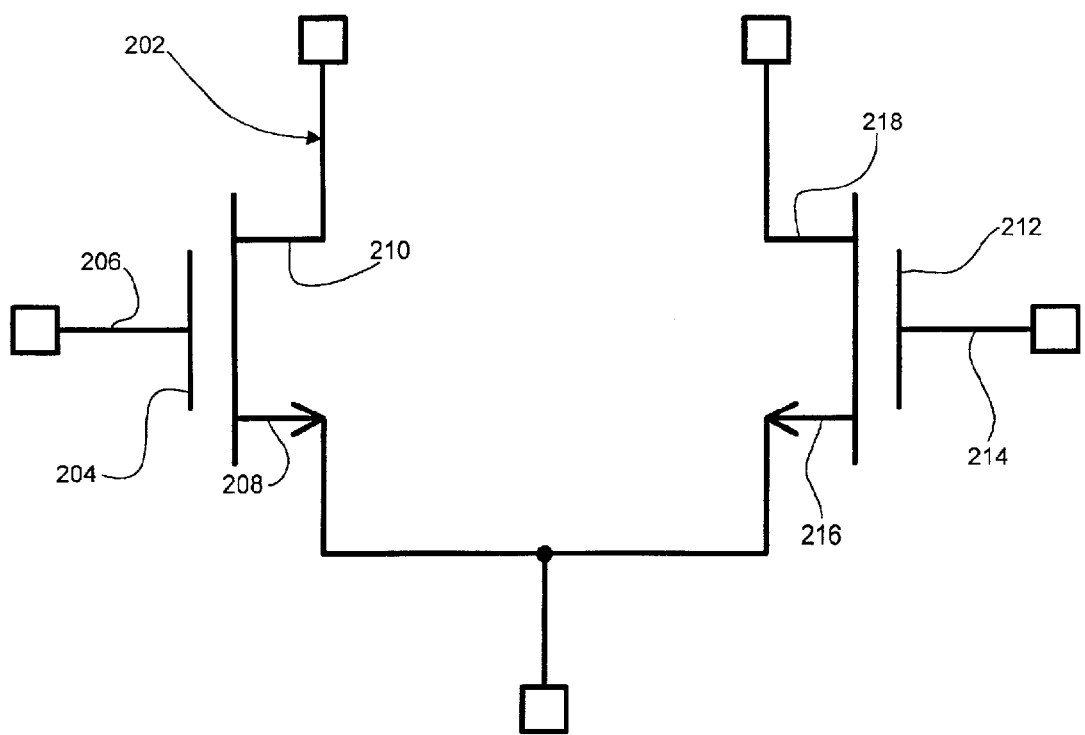

Differential Pair with Current Source

Parameters

- 320 — $W_f$
- 322 — $L_f$
- 324 — $N_f$
- 326 — Current
- 328 — Style
- 330 — Slice
- 332 — Bulk Contact

Symbol

Fig. 4      Current Mirror

Parameters $W_f$ 420
$L_f$ 422
$N_f$ 424
Current 426
Style 428
Slice 430
Bulk Contact 432

Symbol

NMOS Transistor Subcircuit Model

METHOD AND SYSTEM FOR PREDICTIVE MULTI-COMPONENT CIRCUIT LAYOUT GENERATION WITH REDUCED DESIGN CYCLE

BACKGROUND OF THE INVENTION

1. Field of the Invention

The present invention is generally in the field of circuit design. More specifically, the present invention is in the field of designing multi-component circuits.

2. Background Art

The demand for advanced consumer electronic devices, such as cellular phones and other wireless devices, has challenged semiconductor manufacturers to reduce the time-to-market for the integrated circuits ("IC") these products contain. In an effort to meet that challenge, semiconductor manufacturers use automated design systems that provide the designer with sets of tools and methodologies that reduce the entire design cycle of the IC.

A typical IC design system includes a design cycle that comprises various steps. For example, the steps in an IC design cycle can include circuit design and simulation, circuit layout generation, circuit layout verification, extraction of parasitics from the circuit layout, and circuit re-simulation with the extracted parasitics. The initial circuit design and simulation is performed before the designer has knowledge of the exact layout of the entire circuit, which is generated later in the design cycle. As a result, the designer has to attempt to predict and counter the effect of various parasitics that might be introduced during layout design, which can severely degrade circuit performance.

Additionally, ICs can include multi-component circuits, such as differential pairs, differential pairs with current sources, and current mirrors that comprise two or more transistors. In addition to the parasitics generated, for example, by each transistor in a multi-component circuit, the parasitics generated by the interconnect that connects the gates, sources, and drains of each transistor in the multi-component circuit must be accurately determined to design the multi-component circuit.

Timing, voltage levels, and race conditions have to be re-verified after the designer knows of exact parasitics, such as parasitic capacitance, resistance, and inductance, extracted from circuit layout. Thus, a new circuit simulation incorporating correct values of the extracted parasitics from the circuit layout is required. Even then, the new circuit layout will often result in different values of extracted parasitics. Some parasitics may be eliminated, some new ones may be introduced, and some may increase it or decrease, as such resulting in the need to redesign and re-simulate the circuit. The above steps are repeated, where the circuit design is modified by re-extracted parasitics from the circuit layout.

Without precise knowledge of the parasitics inherent in the circuit layout, the designer has to continually attempt to predict what new parasitics might be generated from the latest circuit modifications. Thus, the circuit's design cycle continues through numerous, time consuming iterations until the circuit layout parasitics have been correctly taken into account during the circuit design and simulation cycle. This repetitious cycle can result in many days or weeks of delay in completion of the circuit design for large circuit blocks. The resulting increase in "time-to-market" causes a tremendous economic loss to semiconductor design houses and manufacturers.

FIG. 1 shows flowchart 100, which illustrates a typical sequence of steps in a circuit block's design, layout, and verification. In step 102 in FIG. 1, a circuit block is designed and a schematic for the circuit block is made. The circuit block is also simulated in step 102. The circuit block can be designed with the assistance of a commercial circuit design editor, such as Composer®, by Cadence Design Systems®, Inc. For a multi-component circuit can be input in the circuit block schematic. As a part of the circuit block design and schematic formation, parameters such as "finger width" ("$W_F$"), "finger length" ("$L_F$"), and "number of fingers" ("$N_F$") of each transistor in the multi-component circuit can be input in the circuit design editor and into the block schematic.

A simulation program can simulate the electrical behavior of a circuit block using the parameters that were input for the circuit block's components. However, the accuracy of the results obtained from the circuit simulation depend on the accuracy of all the circuit components, including a large number of parasitic components, whose values cannot generally be accurately estimated by conventional design techniques. The circuit simulation can be written and performed, for example, by using the SPECTRE® program.

In step 104, a circuit block layout is generated using a layout generator. The layout generator program can be written in SKILL®, C++, a combination of the two languages, or a combination of a number of other languages. In step 106 in FIG. 1, a design rule check ("DRC") and a layout versus circuit schematic ("LVS") verification is performed on the circuit block layout generated in step 104. DRC is performed to ensure that the circuit block layout conforms to all manufacturing specifications. For example, the DRC program identifies problems such as "minimum-spacing" violations and "minimum-width" violations. In LVS, the circuit block layout is checked against the circuit block schematic to ensure electrical equivalence. In other words, the circuit block layout is checked to see that it corresponds to the circuit block schematic. By way of example, the LVS checking can be implemented using the Calibre® program and a rule file written in Calibre® format.

In step 108, parasitics are extracted from the circuit block layout. For example, each transistor's "internal" parasitics and the parasitics generated by the interconnect routing between each transistor in a multi-component circuit and other circuit block components, are extracted.

It is noted that a multi-component circuit's internal parasitics have a great effect on circuit performance. The internal and interconnect routing parasitics are used by the circuit designer to modify the circuit block schematic in step 102, and the circuit design cycle comprising steps 102, 104, 106, and 108 begins anew. A modified circuit block layout is generated in step 104, and DRC and LVS are performed on the modified circuit block layout in step 106. In step 108, parasitics are extracted from the modified circuit block layout. Thus, the circuit design cycle comprising steps 102, 104, 106, and 108 as discussed above is repeated until circuit block design and simulation step 102 can be performed with a high degree of confidence in the parasitic values that correspond to the circuit block layout and, in particular, to the multi-component circuit layout. As discussed above, the repetitive circuit design cycle significantly increases the time-to-market for ICs with multi-component circuits.

Therefore, there exists a need for an integrated design system that provides a reduction in the time-to-market for integrated circuits comprising multi-component circuits. More specifically, there exists a need for an integrated design system that is able to predict the parasitics that will result from a multi-component circuit layout before the layout is generated, and thereby minimize undesirable repetition of the circuit design cycle.

SUMMARY OF THE INVENTION

The present invention is directed to method and system for predictive multi-component circuit layout generation with reduced design cycle. The invention provides a reduction in the time-to-market for integrated circuits. More specifically, the invention is an integrated design system that is able to predict the parasitics that will result from a multi-component circuit layout before the layout is generated, thereby minimizing undesirable repetitions in the circuit design cycle.

In one embodiment, the invention receives a number of parameter values for a multi-component circuit. From the received parameter values, a number of parasitic values for various components in the multi-component circuit are determined. For example, parasitic resistor values and parasitic capacitor values for transistors in the multi-component circuit are determined.

The parasitic resistor values and parasitic capacitor values are used in simulating the multi-component circuit. According to the present invention, a layout of the multi-component circuit is then generated that results in parasitic values that are the same as the parasitic values already used in simulating the multi-component circuit. As such, the parasitic values of the multi-component circuit have already been taken into account in the initial circuit simulation and there is no need to extract the internal parasitics of the multi-component circuit for further circuit simulations. Moreover, the invention results in predictable multi-component circuits whose characteristics and parasitics are matched.

BRIEF DESCRIPTION OF THE DRAWINGS

FIG. 2 shows a symbol and the corresponding parameters of an exemplary differential pair circuit according to one embodiment of the present invention.

DETAILED DESCRIPTION OF THE INVENTION

Figure 1:
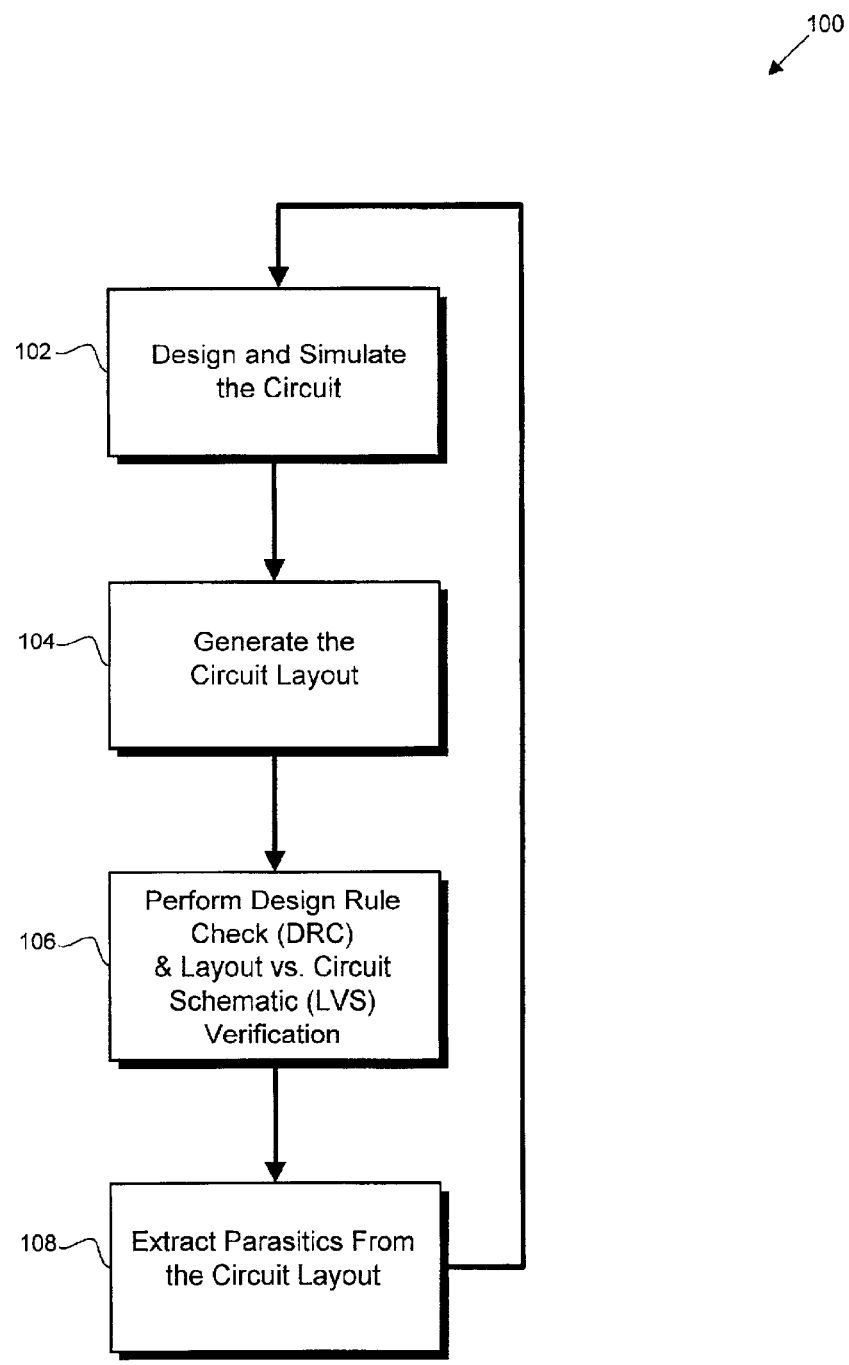
FIG. 1 is a flowchart of steps taken in a conventional circuit design cycle.

The present invention is directed to method and system for predictive multi-component circuit layout generation with reduced design cycle. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

It is noted that although the various embodiments of the invention described below are specifically directed to multi-component circuits such as a differential pair, a differential pair with current source, and a current mirror, the invention applies generally to predictively generate a layout, and reduce the design cycle, of other types of multi-component circuits such as operational amplifiers, RAM or ROM cells, or various common circuit blocks, such as I/O blocks. However, in order to preserve brevity, the multitude of other types of multi-component circuits to which the present invention applies are not specifically discussed in the present application.

FIG. 2 shows a symbol and the corresponding parameters of an exemplary differential pair. Differential pair symbol 202 comprises NMOS transistor 204 and NMOS transistor 212. NMOS transistor 204 comprises gate 206, source 208, and drain 210, and NMOS transistor 212 comprises gate 214, source 216, and drain 218. In differential pair symbol 202, source 208 of NMOS transistor 204 is connected to source 216 of NMOS transistor 212. Thus, when differential pair symbol 202 is input in a circuit schematic, a differential pair is indicated comprising two interconnected NMOS transistors, such as NMOS transistors 204 and 212.

Also shown in FIG. 2, $W_f$ 220, $L_f$ 222, $N_f$ 224, Current 226, Style 228, Slice 230, and Bulk Contact 232 are exemplary differential pair parameters utilized in an exemplary embodiment of the present invention to predict the parasitics of a differential pair layout that will be generated using the same differential pair parameters listed above. In the present exemplary embodiment, the same set of above listed differential pair parameters determines the layout of each of the NMOS transistors, i.e. NMOS transistors 204 and 212, in the corresponding differential pair layout. In another embodiment one or more of the above listed differential pair parameters may be different for each NMOS transistor, i.e. NMOS transistor 204 and 212, in the corresponding differential pair layout. An exemplary differential pair layout will be discussed in detail below in relation to FIG. 6. The differential pair parameters listed above are input in a circuit block schematic and will be discussed below.

In FIG. 2, differential pair parameter $W_f$ 220 determines the channel width of a gate finger of each NMOS transistor in the corresponding differential pair layout. In this embodiment of the invention, although the NMOS transistors, i.e. NMOS transistors 204 and 212, in a differential pair layout may have multiple gate fingers connected in parallel, each gate finger will generally have the same channel width specified by differential pair parameter $W_f$ 220. The total channel width of each NMOS transistor gate is equal to the number of gate fingers times the value of $W_f$ 220. The channel width of a gate finger is one factor that determines the size and geometry of an NMOS transistor, and thus the size and geometry of a differential pair. Thus, differential pair parameter $W_f$ 220 affects the size and geometry of a differential pair. In the present application, the numerical value of parameter $W_f$ 220 is also referred to as a "finger width parameter value."

Differential pair parameter $L_f$ 222 determines the channel length of a gate finger of each NMOS transistor in a differential pair layout. The total channel length of each NMOS transistor gate in a differential pair layout is equal to the value of $L_f$ 222, independent of the number of gate fingers of each NMOS transistor gate. In the present embodiment, the gate of each NMOS transistor in a differential pair layout may have one or more fingers; however, each finger has the same channel length, referred to by $L_f$ 222. For example, in an exemplary differential pair, $L_f$ 222 can be 0.35 micron. In the present application, the numerical value of parameter $L_f$ 222 is also referred to as a "finger length parameter value."

Also in FIG. 2, differential pair parameter $N_f$ 224 determines the number of gate fingers connected in parallel in each NMOS transistor in a differential pair layout. For example, if the value of $N_f$ 224 were equal to ten, ten gate fingers would be connected in parallel in each NMOS transistor in a differential pair layout. According to the present embodiment, there is no design limit on the number of gate fingers in each NMOS transistor in a differential pair layout; however, the number of gate fingers can be an integer or even a non-integer number. In the present application, the numerical value of parameter $N_f$ 224 is also referred to as a "number of fingers parameter value."

In FIG. 2, differential pair parameter Current 226 determines the maximum electromigration current of each NMOS transistor in a differential pair layout. For example, if the value of differential pair parameter Current 226 is equal to 1.0 milliampere, the metal contacting the source and drain of each NMOS transistor in a differential pair layout must be wide enough to accommodate at least 1.0 milliampere of current flow, without resulting in electromigration problems. Thus, differential pair parameter Current 226 determines the width of the metal interconnect that connect to the source and drain of each NMOS transistor in a corresponding differential pair layout. In the present application, the numerical value of parameter Current 226 is also referred to as a "current parameter value."

Further in FIG. 2, in the present embodiment of the invention, differential pair parameter Style 228 specifies the "layout style" used for each NMOS transistor in a differential pair layout. A "layout style" determines how gate fingers, source areas, and drain areas of each NMOS transistor are connected together. Moreover, the layout style determines how interconnect lines are routed and connect to the gate fingers, source areas, and drain areas of each NMOS transistor in a differential pair layout. For example, in differential pair parameter "Style 1" layout, the source areas of each NMOS transistor are connected in the metal level one, and the drain areas of each NMOS transistor are connected in metal level two. By way of another example, in differential pair parameter "Style 2" layout, source areas are connected in the same metal level as the drain areas in each NMOS transistor. By way of yet another example, in differential pair parameter "Style 4" layout, neither source areas, drain areas, nor gate fingers are connected together, thereby providing a designer maximum flexibility in determining how to optimally route interconnect lines to the gate, drain, and source areas of each NMOS transistor.

Differential pair parameter Slice 230 determines the number of "sub-differential pairs" that are connected in parallel in a differential pair layout. For example, for a value of differential pair parameter Slice 230 equal to four, a wide differential pair can be split up into four "sub-differential pairs" that are connected in parallel. The resulting sub-differential pairs are called "slices." In the present application, the numerical value of parameter Slice 230 is also referred to as a "slice parameter value."

Continuing with FIG. 2, differential pair parameter Bulk Contact 232 determines the location of the "bulk" (i.e. substrate) contacts for each NMOS transistor in a differential pair layout. In an embodiment of the present invention, differential pair parameter Bulk Contact 232 can designate four locations for a strip of substrate contacts for each NMOS transistor in a differential pair layout. For example, differential pair parameter Bulk Contact 232 can designate "l", "r", "t", or "b", respectively, to indicate bulk contacts on the left side, right side, top, or bottom of each NMOS transistor in a differential pair layout. Differential pair parameter Bulk Contact 232 can also designate "n" to indicate no bulk contacts in a differential pair layout. Differential pair parameter Bulk Contact 232 can further designate any combination of "l", "r", "t", or "b" to indicate multiple locations of bulk contacts in a differential pair layout. By further example, differential pair parameter Bulk Contact 232 equal to "rt" designates a strip of bulk contacts on the right side and a strip of bulk contacts on the top of each NMOS transistor in a corresponding differential pair layout. The strip of bulk contacts is typically located as close to each NMOS transistor in a differential pair layout as design rules allow. In the present application, each designation such as "l", "r", "t", or "b", "n", and "rt" is also referred to as a "bulk contact parameter value."

Figure 3:
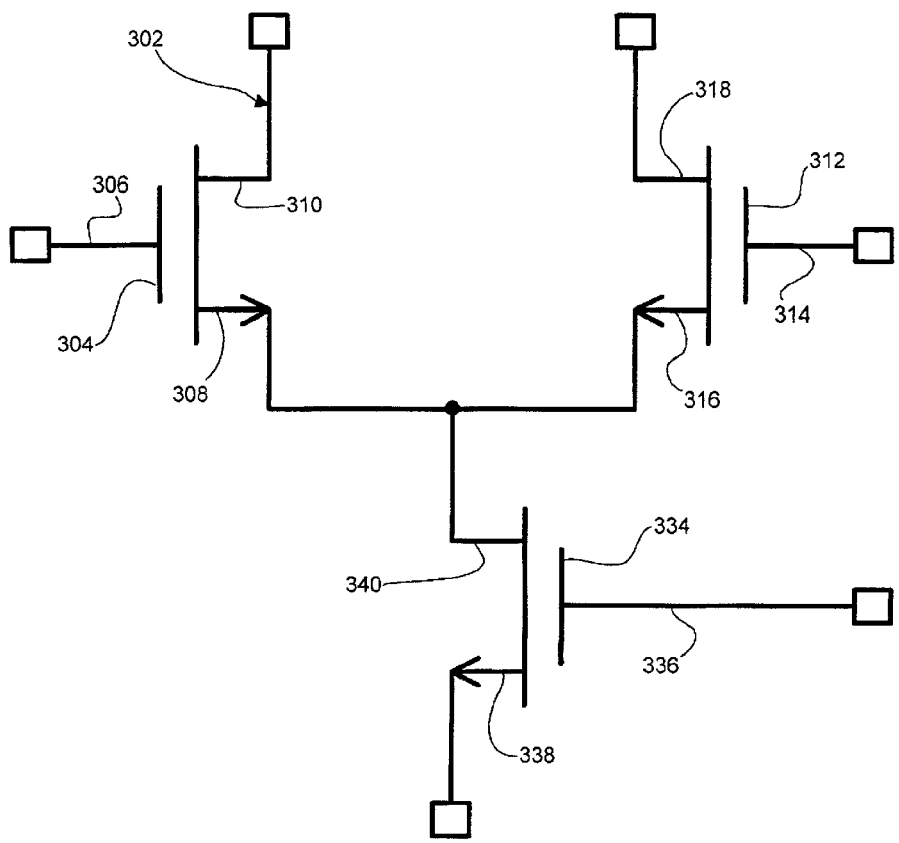
FIG. 3 shows a symbol and the corresponding parameters of an exemplary differential pair circuit with current source according to one embodiment of the present invention.

FIG. 3 shows a symbol and the corresponding parameters of an exemplary differential pair with current source. Differential pair with current source symbol 302 comprises NMOS transistors 304, 312 and 334. NMOS transistors 304, 312, and 334, respectively, comprise gates 306, 314, and 336, sources 308, 316, and 338, and drains 310, 318, and 340. In differential pair with current source symbol 302, source 308 of NMOS transistor 304 and source 316 of NMOS transistor 312 are connected to drain 340 of NMOS transistor 334. Thus, when differential pair with current source symbol 302 is input in a circuit schematic, a differential pair with current source circuit is indicated comprising three interconnected NMOS transistors, such as NMOS transistors 304, 312, and 334.

Also shown in FIG. 3, $W_f$ 320, $L_f$ 322, $N_f$ 324, Current 326, Style 328, Slice 330, and Bulk Contact 332 are exemplary differential pair with current source parameters utilized in an exemplary embodiment of the present invention to predict the parasitics of a differential pair with current source layout that will be generated using the differential pair with current source parameters listed above. In the present exemplary embodiment, the same set of above listed differential pair with current source parameters determines the layout of each of the NMOS transistors, i.e. NMOS transistors 304, 312, and 334, in the corresponding differential pair with current source layout. In another embodiment, one or more of the above listed differential pair with current source parameters may be different for one, two, or all three NMOS transistors. An exemplary differential pair with current source layout will be discussed in detail below in relation to FIG. 7.

Differential pair with current source parameters $W_f$ 320, $L_f$ 322, $N_f$ 324, Current 326, Style 328, Slice 330, and Bulk Contact 332, respectively, correspond to differential pair parameters $W_f$ 220, $L_f$ 222, $N_f$ 224, Current 226, Style 228, Slice 230, and Bulk Contact 232 in FIG. 2. For example, differential pair parameters $W_f$ 220, $L_f$ 222, $N_f$ 224, Current 226, Style 228, Slice 230, and Bulk Contact 232 in FIG. 2 determine the layout of each NMOS transistor indicated by differential pair symbol 202, such as NMOS transistors 204 and 212, in a corresponding differential pair layout. Similarly, differential pair with current source parameters $W_f$ 320, $L_f$ 322, $N_f$ 324, Current 326, Style 328, Slice 330, and Bulk Contact 332 determine the layout of each NMOS transistor indicated by differential pair with current source symbol 302, such as NMOS transistors 304, 312, and 334, in a corresponding differential pair with current source layout. Since the differential pair with current source parameters listed above are similar to differential pair parameters $W_f$ 220, $L_f$ 222, $N_f$ 224, Current 226, Style 228, Slice 230, and Bulk Contact 232 in FIG. 2, the differential pair with current source parameters are not discussed in detail herein to preserve brevity.

Figure 4:
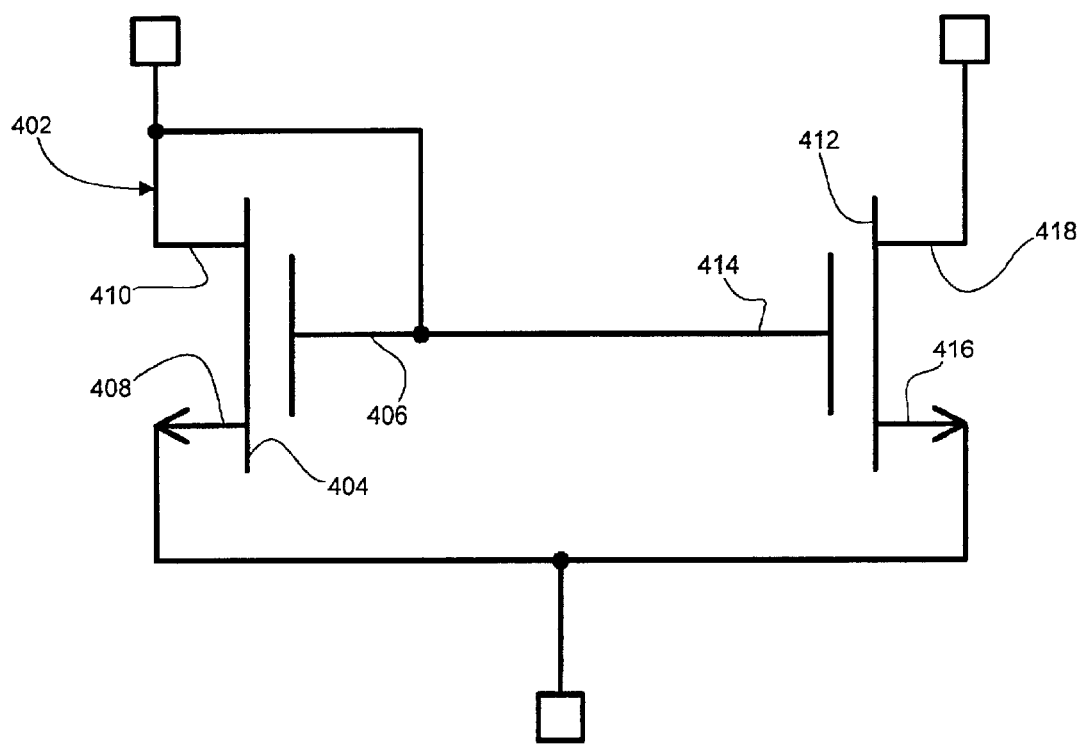
FIG. 4 shows a symbol and the corresponding parameters of an exemplary current mirror circuit according to one embodiment of the present invention.

FIG. 4 shows a symbol and the corresponding parameters of an exemplary current mirror. Current mirror symbol 402 comprises NMOS transistors 404 and 412. NMOS transistors 404 and 412, respectively, comprise gates 406 and 414, sources 408 and 416, and drains 410 and 418. In current mirror symbol 402, source 408 of NMOS transistor 404 is connected to source 416 of NMOS transistor 412. Gate 406 is connected to drain 410 of NMOS transistor 402, and gate 406 is also connected to gate 414 of NMOS transistor 412. Thus, when current mirror symbol 402 is input in a circuit schematic, a current mirror circuit is indicated comprising two interconnected NMOS transistors, such as NMOS transistors 404 and 412.

Also shown in FIG. 4, $W_f$ 420, $L_f$ 422, $N_f$ 424, Current 426, Style 428, Slice 430, and Bulk Contact 432 are exemplary current mirror parameters utilized in an exemplary embodiment of the present invention to predict the parasitics of a current mirror layout that will be generated using the same current mirror parameters listed above. In the present exemplary embodiment, the same set of above listed current mirror parameters determines the layout of each NMOS transistors, i.e. NMOS transistors 404 and 412, in a corresponding current mirror layout. In another embodiment, one or more of the above listed current mirror parameters may be different for each NMOS transistor, i.e. NMOS transistors 404 and 412, in the corresponding current mirror layout. An exemplary current mirror layout will be discussed in detail below in relation to FIG. 8.

Current mirror parameters $W_f$ 420, $L_f$ 422, $N_f$ 424, Current 426, Style 428, Slice 430, and Bulk Contact 432, respectively, correspond to differential pair parameters $W_f$ 220, $L_f$ 222, $N_f$ 224, Current 226, Style 228, Slice 230, and Bulk Contact 232 in FIG. 2, and also correspond to differential pair with current source parameters $W_f$ 320, $L_f$ 322, $N_f$ 324, Current 326, Style 328, Slice 330, and Bulk Contact 332 in FIG. 3. For example, differential pair parameters $W_f$ 220, $L_f$ 222, $N_f$ 224, Current 226, Style 228, Slice 230, and Bulk Contact 232 in FIG. 2 determine the layout of each NMOS transistor indicated by differential pair symbol 202, such as NMOS transistors 204 and 212, in a corresponding differential pair layout. Similarly, current mirror parameters $W_f$ 420, $L_f$ 422, $N_f$ 424, Current 426, Style 428, Slice 430, and Bulk Contact 432 determine the layout of each NMOS transistor indicated by current mirror symbol 402, such as NMOS transistors 404 and 412, in a corresponding current mirror layout. Since the current mirror parameters listed above are similar to differential pair parameters $W_f$ 220, $L_f$ 222, $N_f$ 224, Current 226, Style 228, Slice 230, and Bulk Contact 232 discussed above in relation to FIG. 2, the current mirror parameters are not discussed in detail herein to preserve brevity.

Figure 5:
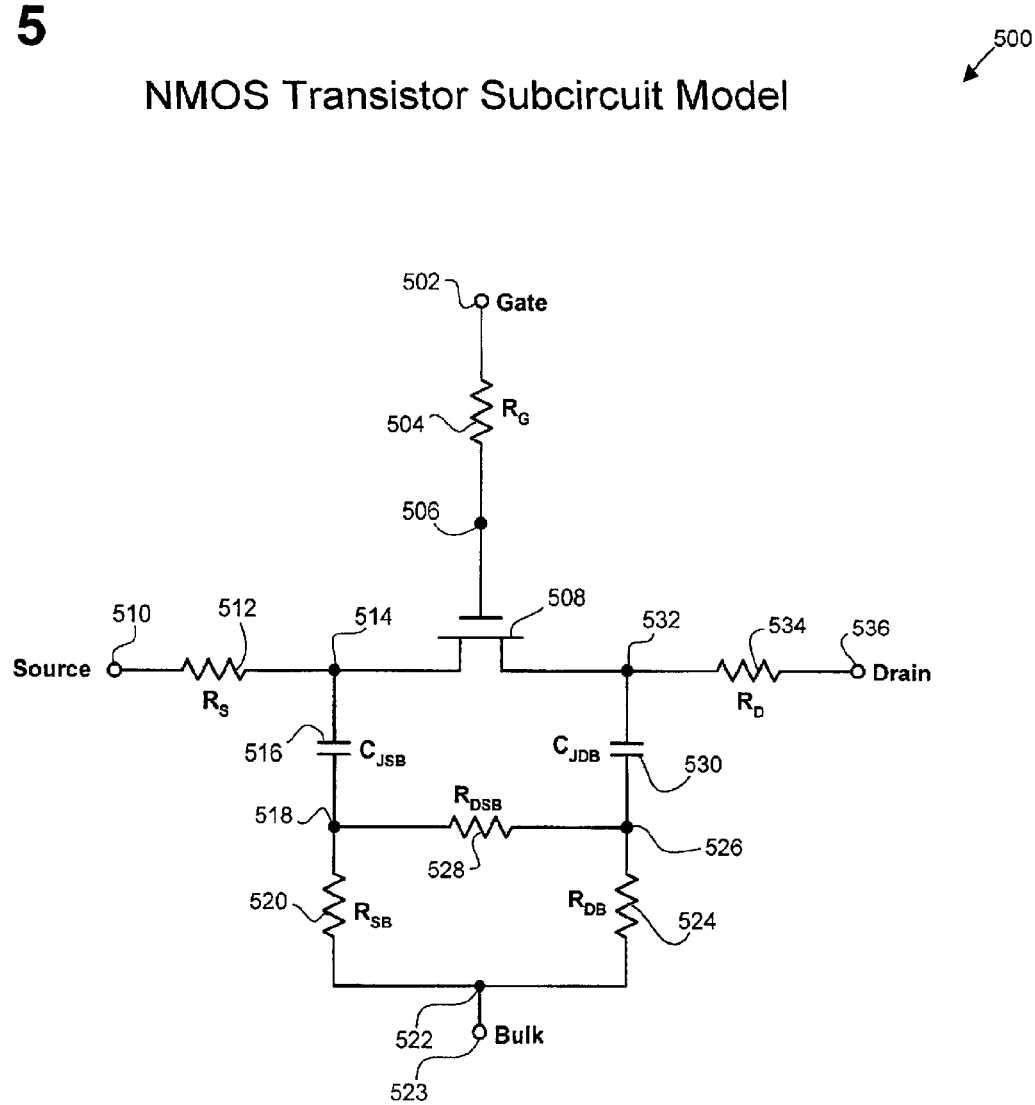
FIG. 5 shows a schematic diagram of an exemplary NMOS transistor subcircuit model in accordance with one embodiment of the present invention.

NMOS transistor subcircuit model 500 in FIG. 5 shows a schematic diagram of an exemplary NMOS transistor subcircuit model in accordance with one embodiment of the present invention. NMOS transistor subcircuit model 500 illustrates the internal parasitic resistances and capacitances of an NMOS transistor comprising gate 502, drain 536, and source 510. NMOS 508 in FIG. 5 represent an ideal NMOS transistor without internal parasitic resistances and capacitances, hence referred to as an "ideal" NMOS transistor.

In FIG. 5, resistor $R_G$ 504 is connected between gate 502 and node 506. The gate of ideal NMOS transistor 508 is also connected to node 506. Resistor $R_S$ 512 is connected between source 510 and node 514. The source of ideal NMOS transistor 508 is connected to node 514. Capacitor $C_{JSB}$ 516 is connected between node 514 and node 518. Resistor $R_{SB}$ 520 is connected between node 518 and node 522. Resistor $R_{DB}$ 524 is connected between node 522 and node 526. Bulk 523 is connected at node 522. Resistor $R_{DSB}$ 528 is connected between node 518 and node 526. Capacitor $C_{JDB}$ 530 is connected between node 526 and node 532. The drain of ideal NMOS transistor 508 is also connected to node 532. Resistor $R_D$ 534 is connected between node 532 and drain 536.

Now discussing FIG. 5 in more detail, NMOS transistor subcircuit model 500 in FIG. 5 is a simulation model that is used to precisely predict the electrical behavior of an NMOS transistor that is laid out using NMOS transistor parameters $W_f$, $L_f$, $N_f$, Current, Style, Slice, and Bulk Contact (not shown in FIG. 5). NMOS transistor parameters $W_f$, $L_f$, $N_f$, Current, Style, Slice, and Bulk Contact, respectively, correspond to differential pair parameters $W_f$ 220, $L_f$ 222, $N_f$ 224, Current 226, Style 228, Slice 230, and Bulk Contact 232 in FIG. 2. NMOS transistor parameters $W_f$, $L_f$, $N_f$, Current, Style, Slice, and Bulk Contact, respectively, also correspond to differential pair with current source parameters $W_f$ 320, $L_f$ 322, $N_f$ 324, Current 326, Style 328, Slice 330, and Bulk Contact 332 in FIG. 3, and further correspond to current mirror parameters $W_f$ 420, $L_f$ 422, $N_f$ 424, Current 426, Style 428, Slice 430, and Bulk Contact 432 in FIG. 4.

Continuing with FIG. 5, parasitic resistors $R_G$ 504, $R_S$ 512, $R_{SB}$ 520, $R_{DSB}$ 528, $R_{DB}$ 524, $R_D$ 534, and parasitic capacitors $C_{JSB}$ 516 and $C_{JDB}$ 530 in FIG. 5 represent the internal parasitic resistances and capacitances of an NMOS transistor laid out in the manner specified by NMOS transistor parameters $W_f$, $L_f$, $N_f$, Current, Style, Slice, and Bulk Contact. As discussed below, NMOS transistor subcircuit model 500 uses various combinations of the above listed NMOS transistor parameters to calculate values of parasitic resistors $R_G$ 504, $R_S$ 512, $R_S$ 520, $R_{DSB}$ 528, $R_{DB}$ 524, $R_D$ 534, and parasitic capacitors $C_{JSB}$ 516 and $C_{JDB}$ 530 in FIG. 5.

In one embodiment, the value of $R_G$ 504, the NMOS transistor parasitic gate resistance, is affected by NMOS transistor parameters $W_f$, $L_f$, $N_f$, Style, and Slice. The value of $R_S$ 512, the NMOS transistor parasitic source resistance, is affected by NMOS transistor parameters $W_f$, $N_f$, and Slice. The value of $R_{SB}$ 520, the NMOS transistor parasitic source-to-bulk (i.e. substrate) resistance, is affected by NMOS transistor parameters $W_f$, $L_f$, $N_f$, Current, Style, Slice, and Bulk Contact. The value of $R_{DSB}$ 528, the NMOS transistor parasitic source-to-drain resistance through the bulk, is affected by no NMOS transistor parameters $W_f$, $L_f$, $N_f$, Style, Slice, and Bulk Contact. The value of $R_{DB}$ 524, the NMOS transistor parasitic drain-to-bulk resistance, is affected by NMOS transistor parameters $W_f$, $L_f$, $N_f$, Current, Style, Slice, and Bulk Contact. The value of $R_D$ 534, the NMOS transistor parasitic drain resistance, is affected by NMOS transistor parameters $W_f$, $N_f$, and Slice.

The value of $C_{JSB}$ 516, the NMOS transistor parasitic source-to-bulk capacitance, is affected by NMOS transistor parameters $W_f$, $N_f$, and Slice. The value of $C_{JDB}$ 530, the NMOS transistor parasitic drain-to-bulk capacitance, is also affected by NMOS transistor parameters $W_f$, $N_f$, and Slice. The performance of NMOS transistor 508 is determined by NMOS transistor parameters $W_f$, $L_f$, $N_f$, and Slice. Thus the present invention utilizes NMOS transistor subcircuit model 500 in FIG. 5 and works in conjunction with other components of the present invention, such as multi-component circuit parameters $W_f$, $L_f$, $N_f$, Current, Style, Slice, and Bulk Contact, to predict the parasitic resistance and capacitance values associated with a particular layout of a multi-component circuit comprising NMOS transistors, even before a circuit block containing the multi-component circuit, and the multi-component circuit itself, are laid out.

Figure 6:
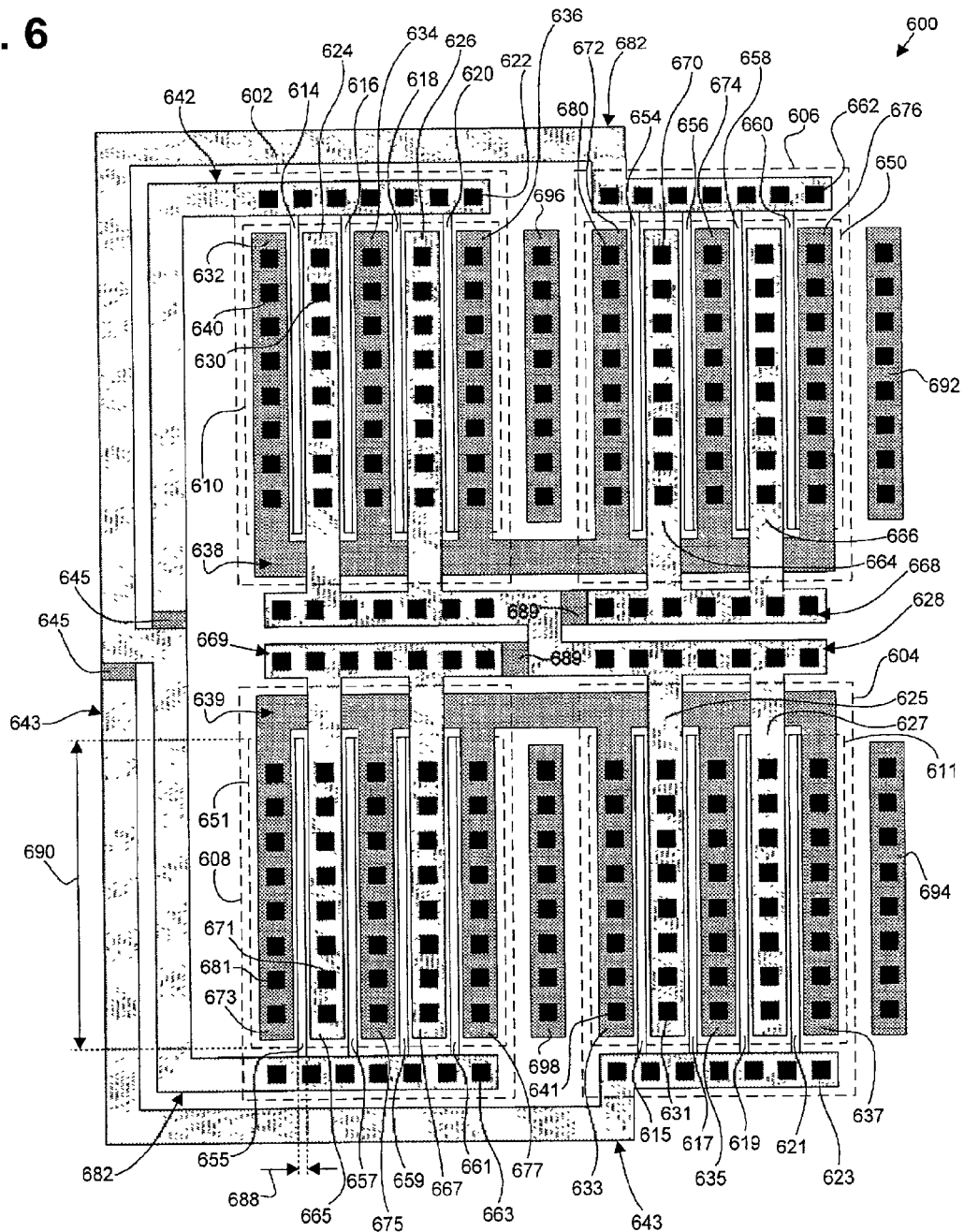
FIG. 6 illustrates an exemplary layout of a differential pair according to an embodiment of the present invention.

Differential pair layout 600 in FIG. 6 illustrates an exemplary differential pair layout in accordance with one embodiment of the present invention. Differential pair layout 600 represents the corresponding layout of a differential pair comprising NMOS transistor A and NMOS transistor B, where, for example, transistor A corresponds to transistor 204 and transistor B corresponds to transistor 212 in FIG. 2. Differential pair layout 600 comprises ½ NMOS transistor A layout 602, ½ NMOS transistor A layout 604, ½ NMOS transistor B layout 606, and ½ NMOS transistor B layout 608 as shown by corresponding dashed-lined boxes.

As shown in FIG. 6, ½ NMOS transistor A layout 602 comprises diffusion area 610 and gate fingers 614, 616, 618, and 620. Gate fingers 614, 616, 618, and 620 are attached to a common polycrystalline silicon ("poly") line (not shown in FIG. 6). The common poly line can be, for example, connected by contacts to a common gate metal (not shown in FIG. 6) in metal level one, and further connected by vias (not shown in FIG. 6) to a common gate metal 642 in, for example, metal level two. In another embodiment, the common poly line can be connected by contacts to a common gate metal in metal level one, and then connected by vias to higher metal levels until a desired higher metal level is reached, such as metal level three.

Gate contact 622 and other gate contacts not specifically numbered are situated on a single row on common gate metal 642 as shown in FIG. 6. ½ NMOS transistor A layout 602 also comprises drain contact strips 624 and 626, which are connected to common drain metal 628. In the present invention's differential pair layout 600, common drain metal 628 can be in metal level two of a semiconductor die. In another embodiment, drain contact strips 624 and 626 can be connected in a higher metal level, such as metal level three. Drain contact strips 624 and 626 are situated over drain areas not shown in FIG. 6. The drain areas under drain contact strips 624 and 628 and the drain areas (not shown in FIG. 6) under drain contact strips 625 and 627 are collectively referred to as "drain" of NMOS transistor A. Drain contact 630 and other drain contacts not specifically numbered are situated on drain contact strip 624.

Also shown in FIG. 6, ½ NMOS transistor A layout 602 further comprises source contact strips 632, 634, and 636, which are connected to common source metal 638. In differential pair layout 600, common source metal 638 can be in metal level one. However, in another embodiment, source contact strips 632, 634, and 636 can be connected in a higher metal level, such as metal level three. Source contact strips 632, 634, and 636 are situated over source areas not shown in FIG. 6. The source areas under source contact strips 632, 634, and 636 and the source areas (not shown in FIG. 6) under source contact strips 633, 635, and 637 are collectively referred to as "source" of NMOS transistor A. Source contact 640 and other source contacts not specifically numbered are situated on source contact strip 632.

Now discussing ½ NMOS transistor A layout 604 in FIG. 6, ½ NMOS transistor A layout 604 comprises diffusion area 611 and gate fingers 615, 617, 619, and 621. Gate fingers 615, 617, 619, and 621 are attached to a common poly line (not shown in FIG. 6). The common poly line can be connected by contacts to common gate metal (not shown in FIG. 6) in metal level one, and further connected by vias (not shown in FIG. 6) to common gate metal 643 in metal level two. In another embodiment, the common poly line can be connected by contacts to common gate metal in metal level one, and then connected by vias from metal level to a higher metal level until a desired higher metal level is reached, such as metal level three. By way of an example, common gate metal 643 can be connected to common gate metal 642 by common gate metal 645 in metal level one. In that case, vias are used to connect common gate metal 643, which is in metal level two, to common gate metal 645 which is in metal level one, and additional vias are used to connect common gate metal 645 to common gate metal 642, which is in metal level two. The connecting vias are not shown to preserve simplicity of FIG. 6. Thus, common gate metal 645, which is in metal level one, connects common gate metals 643 and 642, which are both in metal level two, while underpassing common gate metal 682, which is also in metal level two. In another embodiment, common gate metal 643 can be connected to common gate metal 642 in a higher metal level, such as metal level three. Interconnect metal (not shown in FIG. 6) can connect to common gate metal 645 to provide an input to the differential pair comprising NMOS transistors A and B. Gate contact 623 and other gate contacts not specifically numbered are situated on a single row on common gate metal 643 as shown in FIG. 6.

As shown in FIG. 6, ½ NMOS transistor A layout 604 also comprises drain contact strips 625 and 627, which are connected to common drain metal 628. Thus, common drain metal 628 connects drain contact strips 624 and 626 in ½ NMOS transistor A layout 602 with drain contact strips 625 and 627 in ½ NMOS transistor A layout 604. Common drain metal 628 also provides an output for the differential pair comprising NMOS transistors A and B. Drain contact 631 and other drain contacts not specifically numbered are situated on drain contact strip 625.

Also shown in FIG. 6, ½ NMOS transistor A layout 604 further comprises source contact strips 633, 635, and 637, which are connected to common source metal 639. In differential pair layout 600, common source metal 639 can be in metal level one of a semiconductor die. However, in another embodiment, source contact strips 633, 635, and 637 can be connected to common source metal, such as common source metal 639, in a higher metal level, such as metal level three. Source contact 641 and other source contacts not specifically numbered are situated on source contact strip 633. Common source metal 639 can be connected to common source metal 638 in metal level one, thereby connecting the sources of NMOS transistors A and B. In another embodiment, common source metal 639 can be connected to common source metal 638 in a higher metal level, such as metal level three.

Now discussing ½ NMOS transistor B layout 606 in FIG. 6, ½ NMOS transistor B layout 606 comprises diffusion area 650 and gate fingers 654, 656, 658, and 660. Gate fingers 654, 656, 658, and 660 are attached to a common poly line (not shown in FIG. 6). Similar to the common poly line in ½ NMOS transistor A layout 602, the common poly line in ½ NMOS transistor B layout 606 can be connected by contacts to common gate metal (not shown in FIG. 6) in metal level one, and further connected by vias (not shown in FIG. 6) to common gate metal 682 in metal level two. In another embodiment, the common poly line can be connected by contacts to common gate metal in metal level one, and then connected by vias from metal level to next higher metal level until a desired higher metal level is reached, such as metal level three. Gate contact 662 and other gate contacts not specifically numbered are situated on a single row on common gate metal 682 as shown in FIG. 6.

Also shown in FIG. 6, ½ NMOS transistor B layout 606 also comprises drain contact strips 664 and 666, which are connected to common drain metal 668. In the present invention's differential pair layout 600, common drain metal 668 can be in metal level two. Common drain metal 668 also provides an output for the differential pair comprising NMOS transistors A and B. However, in another embodiment, drain contact strips 664 and 666 can be connected in a higher metal level, such as metal level three. Drain contact strips 664 and 666 are situated over drain areas not shown in FIG. 6. The drain areas under drain contact strips 664 and 666 and the drain areas (not shown in FIG. 6) under drain contact strips 665 and 667 are collectively referred to as "drain" of NMOS transistor B. Drain contact 670 and other drain contacts not specifically numbered are situated on drain contact strip 664.

Also shown in FIG. 6, ½ NMOS transistor B layout 606 further comprises source contact strips 672, 674, and 676, which are connected to common source metal 638. Thus, common source metal 638 connects source contact strips 672, 674, and 676 in ½ NMOS transistor B layout 606 to source contact strips 632, 634, and 636 in ½ NMOS transistor A layout 602. In differential pair layout 600, common source metal 638 can be in metal level one. In another embodiment, source contact strips 632, 634, and 636 can be connected in a higher metal level, such as metal level three. Source contact strips 672, 674, and 676 are situated over source areas not shown in FIG. 6. The source areas under source contact strips 672, 674, and 676 and the source areas (not shown in FIG. 6) under source contact strips 673, 675, and 677 are collectively referred to as "source" of NMOS transistor B. Source contact 680 and other source contacts not specifically numbered are situated on source contact strip 672.

Continuing with FIG. 6, ½ NMOS transistor B layout 608 comprises diffusion area 651 and gate fingers 655, 657, 659, and 661. Gate fingers 655, 657, 659, and 661 are attached to a common poly line (not shown in FIG. 6). The common poly line can be connected by contacts to common gate metal (not shown in FIG. 6) in metal level one, and further connected by via (not shown in FIG. 6) to common gate metal 682 in metal level two. In another embodiment, the common poly line can be connected by contacts to common gate metal in metal level one, and then connected by via from metal level to next higher metal level until a desired higher metal level is reached, such as metal level three. Common gate metal 682 connects the common poly line in ½ NMOS transistor B layout 606 and the common poly line in ½ NMOS transistor B layout 608. Interconnect metal (not shown in FIG. 6) can be connected to common gate metal 682 to provide an input to the differential pair comprising NMOS transistors A and B. Gate contact 663 and other gate contacts not specifically numbered are situated on a single row on common gate metal 682 as shown in FIG. 6.

As shown in FIG. 6, ½ NMOS transistor B layout 608 also comprises drain contact strips 665 and 667, which are connected to common drain metal 669. In the present invention's differential pair layout 600, common drain metal 669 can be in metal level two of a semiconductor die. In another embodiment, drain contact strips 665 and 667 can be connected in a higher metal level, such as metal level three. Common drain metal 669 is connected to common drain metal 668 by common drain metal 689 (partially hidden underneath common drain metal 628 in FIG. 6). Common drain metal 689 can be in metal level one. In another embodiment, common drain metal 669 can be connected to common drain metal 668 in a higher metal level, such as metal level three. Drain contact 671 and other drain contacts not specifically numbered are situated on drain contact strip 665.

Also shown in FIG. 6, ½ NMOS transistor B layout 608 further comprises source contact strips 673, 675, and 677, which are connected to common source metal 639. Thus, common source metal 639 connects source contact strips 673, 675, and 677 in ½ NMOS transistor B layout 608 and source contact strips 633, 635, and 637 in ½ NMOS transistor A layout 604. Common source metal 639 can be connected to common source metal 638 in metal level one. In another embodiment, common source metal 639 can be connected to common source metal 638 in a higher metal level, such as metal level three. Source contact 681 and other source contacts not specifically numbered are situated on source contact strip 673.

FIG. 6 also shows differential pair parameters channel finger length ("$L_f$") 688 and channel finger width ("$W_f$") 690. Differential pair parameters $L_f$ 688 and $W_f$ 690, respectively, determine the channel finger length and channel finger width of NMOS transistors A and B in differential pair layout 600. In an exemplary differential pair, $L_f$ 688 can be 0.35 microns and $W_f$ 690 can be 10.0 microns. FIG. 6 further shows bulk contact strips 692, 694, 696, and 698. Bulk contact strips 692, 694, 696, and 698 can be connected to ground in metal level one. In another embodiment, bulk contact strips 692, 694, 696, and 698 can be connected to ground in a higher metal level, such as metal level three. It is noted that in FIG. 6, only gate contacts 622, 623, 662, and 663, source contacts 640, 641, 680, and 681, and drain contacts 630, 631, 670, and 671 are specifically numbered and discussed herein to preserve brevity. In differential pair layout 600, the source areas of each NMOS transistor, i.e. NMOS transistors A and B, are connected by common source metal, such as common source metals 638 and 639, in metal level one, and the drain areas are connected by common drain metal, such as common drain metals 668 and 669, in metal level two.

According to the present invention, the above described layout style for differential pair 600 can be labeled as a particular style and referred to, for example, as layout "Style 1" corresponding to the layout style of the NMOS transistors A and B comprising the differential pair.

Figure 7:
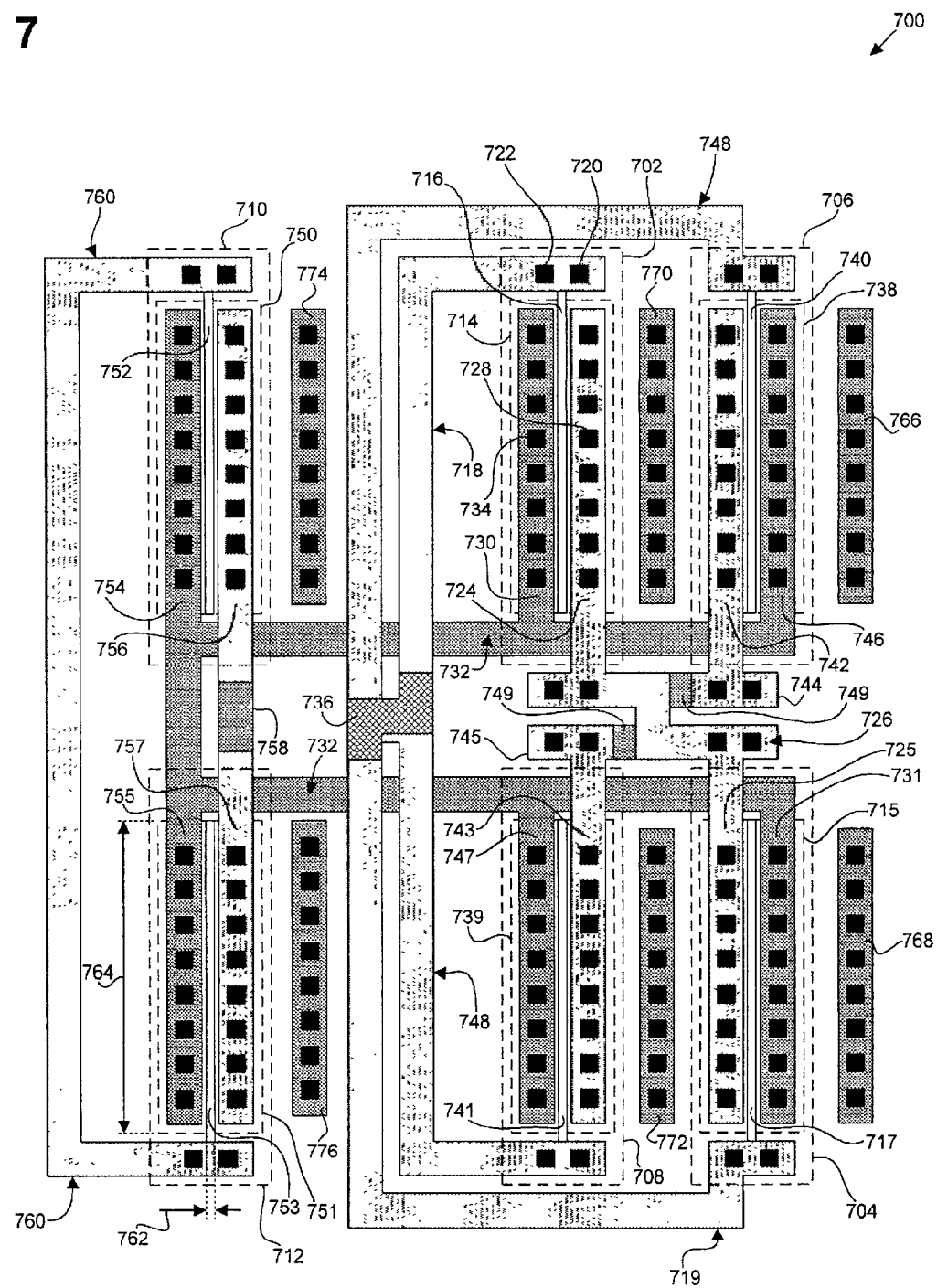
FIG. 7 illustrates an exemplary layout of a differential pair with current source according to an embodiment of the present invention.

As seen in differential pair layout 600, ½ NMOS transistor A and ½ NMOS transistor B are laid out opposite to ½ NMOS transistor B and ½ NMOS transistor A. The above symmetrical layout arrangement in differential pair layout 600 provides a differential pair with a better matched pair of NMOS transistors, i.e. NMOS transistors A and B, than a layout arrangement where the NMOS transistors are laid out side by side. For example, in differential pair layout 600, if there is a process parameter that varies across the semiconductor die, such as an oxide thickness, NMOS transistor A and NMOS transistor B will be similarly affected by the oxide thickness gradient. However, the NMOS transistors were laid out side by side, NMOS transistors A and B would be on opposite ends, and would thus be unequally affected by the oxide thickness gradient., Differential pair with current source layout 700 in FIG. 7 illustrates an exemplary differential pair with current source layout in accordance with one embodiment of the present invention. Differential pair with current source layout 700 represents the corresponding layout of a differential pair with current source comprising NMOS transistors A, B, and C which respectively correspond to, for example, NMOS transistors 304, 312, and 334 in FIG. 3. Differential pair with current source layout 700 comprises ½ NMOS transistor A layout 702, ½ NMOS transistor A layout 704, ½ NMOS transistor B layout 706, ½ NMOS transistor B layout 708, ½ NMOS transistor C layout 710, and ½ NMOS transistor C layout 712.

In FIG. 7, ½ NMOS transistor A layout 702, ½ NMOS transistor A layout 704, ½ NMOS transistor B layout 706, ½ NMOS transistor B layout 708, ½ NMOS transistor C layout 710, and ½ NMOS transistor C layout 712 are similar. Therefore, only ½ NMOS transistor A layout 702 will be discussed in detail below to preserve brevity. As shown in FIG. 7, ½ NMOS transistor A layout 702 comprises diffusion area 714 and gate finger 716. Gate finger 716 is attached to a common poly line (not shown in FIG. 7). The Common poly line can be connected by contacts to common gate metal (not shown in FIG. 7) in metal level one, and further connected by via (not shown in FIG. 7) to common gate metal 718 in metal level two. In another embodiment, the common poly line can be connected by contacts to common gate metal in metal level one, and then connected by vias from metal level to next higher metal level until a desired higher metal level is reached, such as metal level three. Gate contacts 720 and 722 are situated on a single row on common gate metal 718 as shown in FIG. 7.

As shown in FIG. 7, ½ NMOS transistor A layout 702 also comprises drain contact strip 724, which is connected to common drain metal 726. Common drain metal 726 also provides an output for the differential pair with current source comprising NMOS transistors A, B, and C. In the present embodiment, common drain metal 726 can be in metal level two. In another embodiment, drain contact strip 724 can be connected to a common drain metal, such as common drain metal 726, in a higher metal level, such as metal level three. Drain contact strip 724 is situated over a drain area not shown in FIG. 7. The drain area under drain contact strip 724 and the drain area (not shown in FIG. 7) under drain contact strip 725 are collectively referred to as "drain" of NMOS transistor A. Likewise, the drain areas (not shown in FIG. 7) under drain contact strips 742 and 743 are collectively referred to as "drain" of NMOS transistor B. Similarly, the drain areas (not shown in FIG. 7) under drain contact strips 754 and 755 are collectively referred to as "drain" of NMOS transistor C. Drain contact 728 and other drain contacts not specifically numbered are situated on drain contact strip 724.

Also shown in FIG. 7, ½ NMOS transistor A layout 702 further comprises source contact strip 730, which is connected to common source metal 732. In differential pair with current source 700, common source metal 732 can be in metal level one. In another embodiment, source contact strip 730 can be connected to common source metal, such as common source metal 732, in a higher metal level, such as metal level three. Source contact strip 730 is situated over a source area not shown in FIG. 7. The source area under source contact strip 730 and the source area (not shown in FIG. 7) under source contact strip 731 are collectively referred to as "source" of NMOS transistor A. Likewise, the source areas (not shown in FIG. 7) under source contact strips 746 and 747 are collectively referred to as "source" of NMOS transistor B. Similarly, the source areas (not shown in FIG. 7) under source contact strips 756 and 757 are collectively referred to as "source" of NMOS transistor C. Source contact 734 and other source contacts not specifically numbered are situated on source contact strip 730.

Further shown in FIG. 7, ½ NMOS transistor A layout 704 comprises diffusion area 715 and gate finger 717. Gate finger 717 is attached to a common poly line (not shown in FIG. 7). In a similar manner described above in relation to ½ NMOS transistor A layout 702, the common poly line (not shown in FIG. 7) is connected to common gate metal 719. Common gate metal 719 can be connected to interconnect metal (not shown in FIG. 7) in metal level three to provide an input to the differential pair with current source comprising NMOS transistors A, B, and C. ½ NMOS transistor A layout 704 also comprises drain contact strip 725, which is connected to common drain metal 726, and source contact strip 731, which is connected to common source metal 732.

Also shown in FIG. 7, ½ NMOS transistor B layout 706 comprises diffusion area 738 and gate finger 740. Gate finger 740 is attached to a common poly line (not shown in FIG. 7). In a similar manner described above in relation to ½ NMOS transistor A layout 702, the common poly line (not shown in FIG. 7) is connected to common gate metal 748, which can be in metal level two. By way of an example, common gate metal 718 can be connected to common gate metal 719 by common gate metal 736 in metal level one. In that case, vias are used to connect common gate metal 718, which is in metal level two, to common gate metal 736 which is in metal level one, and additional vias are used to connect common gate metal 736 to common gate metal 719, which is in metal level two. The connecting vias are not shown to preserve simplicity of FIG. 7. Thus, common gate metal 736, which is in metal level one, connects common gate metals 718 and 719, which are both in metal level two, while underpassing common gate metal 748, which is also in metal level two. Interconnect metal (not shown in FIG. 7) can be connected to common gate metal 748 to provide an input to differential pair with current source comprising NMOS transistors A, B, and C. ½ NMOS transistor B layout 706 also comprises drain contact strip 742, which is connected to common drain metal 744, and source contact strip 746, which is connected to common source metal 732.

Further shown in FIG. 7, ½ NMOS transistor B layout 708 comprises diffusion area 739 and gate finger 741. Gate finger 741 is attached to a common poly line (not shown in FIG. 7). In a similar manner described above in relation to ½ NMOS transistor A layout 702, the common poly line (not shown in FIG. 7) is connected to common gate metal 748, which can be in metal level two. ½ NMOS transistor B layout 708 also comprises drain contact strip 743, which is connected to common drain metal 745, and source contact strip 747, which is connected to common source metal 732. In the present embodiment, common drain metal 745 can be connected to common drain metal 744 by common drain metal 749 in metal level one. In another embodiment, common drain metal 745 and common drain metal 744 can be connected by common drain metal, such as common drain metal 749, in a higher metal level, such as metal level three.

As shown in FIG. 7, ½ NMOS transistor C layout 710 comprises diffusion area 750 and gate finger 752. Gate finger 752 is attached to a common poly line (not shown in FIG. 7). In a similar manner described above in relation to ½ NMOS transistor A layout 702, the common poly line (not shown in FIG. 7) is connected to common gate metal 760. Interconnect metal (not shown in FIG. 7) can connected to common gate metal 760 to provide an input to the differential pair with current source comprising NMOS transistors A, B, and C. ½ NMOS transistor C layout 710 also comprises drain contact strip 754, which is connected to common source metal 732, and source contact strip 756, which is connected to common source metal 758. In the present embodiment, common source metal 758 can be in metal level one. In another embodiment, source contact strip 756 can be connected to common source metal, such as common source metal 758, in a higher metal level, such as metal level four.

Further shown in FIG. 7, ½ NMOS transistor C layout 712 comprises diffusion area 751 and gate finger 753. Gate finger 753 is attached to a common poly line (not shown in FIG. 7). In a similar manner described above in relation to ½ NMOS transistor A layout 702, the common poly line (not shown in FIG. 7) is connected to common gate metal 760. ½ NMOS transistor C layout 712 also comprises drain contact strip 755, which is connected to common source metal 732, and source contact strip 757, which is connected to common source metal 758. Common source metal 732 connects source contact strips 730, 731, 746, and 747 of NMOS transistors A and B to drain contact strips 754 and 755 of NMOS transistor C. Thus, common source metal 732 connects the "sources" of NMOS transistors A and B to the "drain" of NMOS transistor C.

FIG. 7 also shows differential pair parameters channel finger length ("$L_f$") 762 and channel finger width ("$W_f$") 764. Differential pair parameters $L_f$ 762 and $W_f$ 764; respectively, determine the channel finger length and channel finger width of NMOS transistors A, B, and C in differential pair layout 700. In an exemplary differential pair with current source, $L_f$ 762 can be 0.35 microns and $W_f$ 764 can be 10.0 microns. FIG. 7 further shows bulk contact strips 766, 768, 770, 772, 774, and 776. Bulk contact strips 766, 768, 770, 772, 774, and 776 can be connected to ground in metal level one. In another embodiment, bulk contact strips 766, 768, 770, 772, 774, and 776 can be connected to ground in a higher metal level, such as metal level three. It is noted that in FIG. 7, only gate contacts 720 and 722, source contact 734, and drain contact 728 are specifically numbered and discussed herein to preserve brevity.

As discussed in relation to the differential pair in FIG. 6, the symmetrical arrangement of NMOS transistors A and B in differential pair with current source layout 700 provides a differential pair with a much more closely matched pair of NMOS transistors, i.e. NMOS transistors A and B, than a layout arrangement where the NMOS transistors are laid out side by side.

Figure 8:
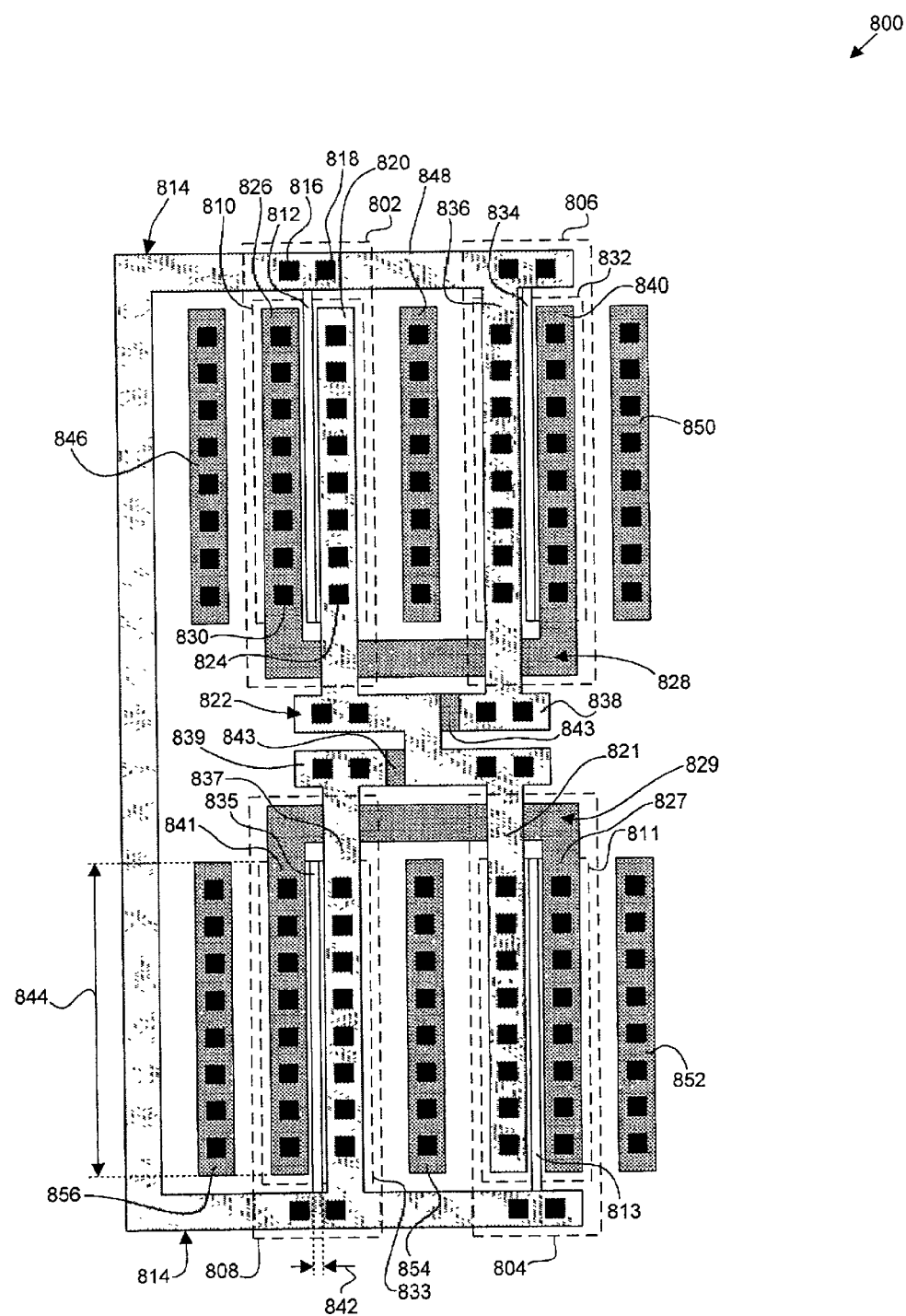
FIG. 8 illustrates an exemplary layout of a current mirror according to an embodiment of the present invention.

Current mirror layout 800 in FIG. 8 illustrates an exemplary current mirror layout in accordance with one embodiment of the present invention. Current mirror layout 800 represents the corresponding layout of a current mirror comprising NMOS transistors A and B corresponding respectively to, for example, NMOS transistors 404 and 412 in FIG. 4. Current mirror layout 800 comprises ½ NMOS transistor A layout 802, ½ NMOS transistor A layout 804, ½ NMOS transistor B layout 806, and ½ NMOS transistor B layout 808.

In FIG. 8, ½ NMOS transistor A layout 802, ½ NMOS transistor A layout 804, ½ NMOS transistor B layout 806, and ½ NMOS transistor B layout 808 are similar. Therefore, only ½ NMOS transistor A layout 802 will be discussed in detail below to preserve brevity. As shown in FIG. 8, ½ NMOS transistor A layout 802 comprises diffusion area 810 and gate finger 812. Gate finger 812 is attached to a common poly line (not shown in FIG. 8). Th common poly line can be connected by contacts to common gate metal (not shown in FIG. 8) in metal level one, and further connected by via (not shown in FIG. 8) to common gate metal 814 in metal level two. In another embodiment, the common poly line can be connected by contacts to common gate metal in metal level one, and then connected by via from metal level to next higher metal level until a desired higher metal level is reached, such as metal level three. Gate contacts 816 and 818 are situated on a single row on common gate metal 814 as shown in FIG. 8.

As shown in FIG. 8, ½ NMOS transistor A layout 802 also comprises drain contact strip 820, which is connected to common drain metal 822. Interconnect metal (not shown in FIG. 8) can be connected to common drain metal 822 to provide an input to the current mirror comprising NMOS transistors A and B. In the present embodiment of the invention's current mirror 800, common drain metal 822 can be in metal level two. In another embodiment, drain contact strip 820 can be connected to common drain metal, such as common drain metal 822, in a higher metal level, such as metal level three. Drain contact strip 820 is situated over a drain area not shown in FIG. 8. The drain area under drain contact strip 820 and the drain area (not shown in FIG. 8) under drain contact strip 821 are collectively referred to as "drain" of NMOS transistor A. Likewise, drain areas (not shown in FIG. 8) under drain contact strips 836 and 837 are collectively referred to as "drain" of NMOS transistor B. Drain contact 824 and other drain contacts not specifically numbered are situated on drain contact strip 820.

Also shown in FIG. 8, ½ NMOS transistor A layout 802 further comprises source contact strip 826, which is connected to common source metal 828. Common source metal 828 can be connected to common source metal 829 in metal level one. In another embodiment common source metal 828 can be connected to common source metal 828 in a higher metal level, such as metal level three. In current mirror 800, common source metal 828 can be in metal level one. In another embodiment, source contact strip 826 can be connected to common source metal, such as common source metal 828, in a higher metal level, such as metal level three. Source contact strip 826 is situated over a source area not shown in FIG. 8. The source area under source contact strip 826 and the source area (not shown in FIG. 8) under source contact strip 829 are collectively referred to as "source" of NMOS transistor A. Likewise, the source areas (not shown in FIG. 8) under source contact strips 840 and 841 are collectively referred to as "source" of NMOS transistor B. Source contact 830 and other source contacts not specifically numbered are situated on source contact strip 826.

Further shown in FIG. 8, ½ NMOS transistor A layout 804 comprises diffusion area 811 and gate finger 813. Gate finger 813 is attached to a common poly line (not shown in FIG. 8). In a manner described above in relation to ½ NMOS transistor A a layout 802, the common poly line (not shown in FIG. 8) is connected to common gate metal 814. ½ NMOS transistor A layout 804 also comprises drain contact strip 821, which is connected to common drain metal 822, and source contact strip 827, which is connected to common source metal 829.

Also shown in FIG. 8, ½ NMOS transistor B layout 806 comprises diffusion area 832 and gate finger 834. Gate finger 834 is attached to a common poly line (not shown in FIG. 8). In a manner described above in relation to ½ NMOS transistor A layout 802, the common poly line (not shown in FIG. 8) is connected to common gate metal 814. ½ NMOS transistor B layout 806 also comprises drain contact strip 836, which is connected to common drain metal 838, and also connected to common gate metal 814. An interconnect (not shown in FIG. 8) can be connected to common drain metal 838 in metal level two to provide an input to the current mirror comprising NMOS transistors A and B. ½ NMOS transistor B layout 806 also comprises source contact strip 840, which is connected to common source metal 828.

Further shown in FIG. 8, ½ NMOS transistor B layout 808 comprises diffusion area 833 and gate finger 835. Gate finger 835 is attached to a common poly line (not shown in FIG. 8). In a manner described above in relation to ½ NMOS transistor A layout 802, the common poly line (not shown in FIG. 8) is connected to common gate metal 814. ½ NMOS transistor B layout 808 also comprises drain contact strip 837, which is connected to common drain metal 839, and source contact strip 841, which is connected to common source metal 829. In the present embodiment, common drain metal 839 can be connected to common drain metal 838 by common drain metal 843 (partially shown in FIG. 8) in metal level one. In another embodiment, common drain metal 839 and common drain metal 838 can be connected in a higher metal level, such as metal level three.

FIG. 8 also shows channel finger length ("$L_f$") 842 and channel finger width ("$W_f$") 844. Differential pair parameters $L_f$ 842 and $W_f$ 844, respectively, determine the channel finger length and channel finger width of NMOS transistors A and B in differential pair layout 800. In an exemplary current mirror, $L_f$ 842 can be 0.35 microns and $W_f$ 844 can be 10.0 microns. FIG. 8 further shows bulk contact strips 846, 848, 850, 852, 854, and 856. Bulk contact strips 846, 848, 850, 852, 854, and 856 can be connected to ground in metal level one. In another embodiment, bulk contact strips 846, 848, 850, 852, 854, and 856 can be connected to ground in a higher metal level, such as metal level three. It is noted that in FIG. 8, only gate contacts 816 and 818, source contact 830, and drain contact 824 are specifically numbered and discussed herein to preserve brevity. As discussed in relation to the differential pair in FIG. 6, the symmetrical arrangement of NMOS transistors A and B in current mirror layout 800 provides a current mirror with a much more closely matched pair of NMOS transistors, i.e. NMOS transistors A and B, than a layout arrangement where the NMOS transistors are laid out side by side.

Figure 9:
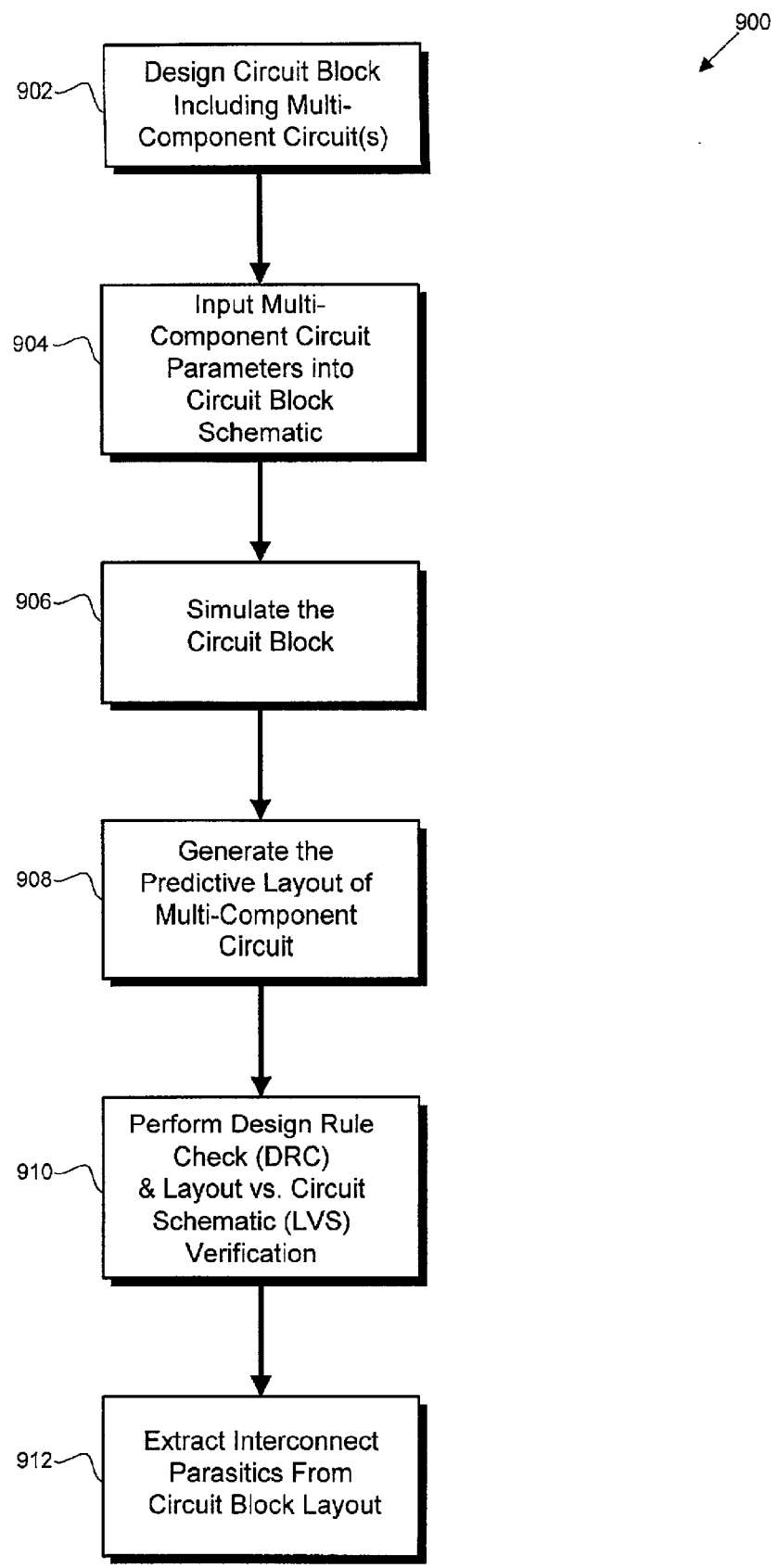
FIG. 9 is a flowchart illustrating a sequence of steps in accordance with an embodiment of the present invention.

FIG. 9 shows flowchart 900, which illustrates a sequence of steps in accordance with an embodiment of the present invention. In step 902, a circuit block comprising at least one multi-component circuit is designed. For example, a circuit block comprising a multi-component circuit such as a differential pair, a differential pair with current source, or a current mirror can be designed. In an embodiment of the invention, a circuit block can be designed and a circuit block schematic assembled with the assistance of a commercial schematic design editor, such as Composer®, by Cadence® Design Systems, Inc.

In step 904, multi-component parameters that exactly determine the layout of the multi-component circuit are input in the circuit block schematic. For example, differential pair multi-component circuit parameters "$W_f$," "$L_f$," "$N_f$," "Current," "Style," "Slice," and "Bulk Contact," corresponding to $W_f$ 220, $L_f$ 222, $N_f$ 224, Current 226, Style 228, Slice 230, and Bulk Contact 232 in FIG. 2, can be input in the circuit block schematic to exactly determine the layout of a differential pair multi-component circuit. In the present invention, the above parameters can be input in the circuit block schematic using a schematic design editor, such as Composer®, by Cadence® Design Systems, Inc.

In step 906 in FIG. 9, the circuit block comprising at least one multi-component circuit is simulated by a simulation program. The multi-component circuit that is included in the circuit block, for example, a differential pair, a differential pair with current source, or a current mirror, comprises two or more NMOS transistors. When the simulation program simulates the multi-component circuit in the circuit block, the NMOS transistors that form the multi-component circuit are simulated using NMOS transistor subcircuit model 500 in FIG. 5. NMOS transistor subcircuit model 500 is calibrated to predict the electrical behavior of an NMOS transistor, including the NMOS transistor's internal parasitics, using the above listed parameters that were input in the circuit block schematic in step 904. For example, in the present invention's differential pair multi-component circuit, the differential pair parameters, such as $W_f$ 220, $L_f$ 222, $N_f$ 224, Current 226, Style 228, Slice 230, and Bulk Contact 232 in FIG. 2, determine the internal parasitics of each NMOS transistor in the differential pair multi-component circuit.

Also, the routing of interconnect metal that connects the NMOS transistors together as required in a particular multi-component circuit, such as a differential pair, is known. Additionally, the routing of interconnect metal mentioned above is in a known relationship to common drain, source, and gate metal that connects the drain and source contact strips and a common poly line together as required in a multi-component circuit layout. Thus, the parasitic resistance, capacitance, and inductance that the above mentioned interconnect metal routing creates can be predicted prior to generation of the multi-component circuit layout.

The relationship between the multi-component circuit parameters listed above and a corresponding multi-component circuit layout generated using the above listed multi-component circuit parameters is discussed in detail below using an exemplary differential pair multi-component circuit. However, the following discussion also applies to differential pair with current source and current mirror multi-component circuits, which also comprise NMOS transistors. Moreover, the method of the present invention described in relation to FIG. 9 applies to predictively generate a layout, and reduce the design cycle, of other types of multi-component circuits such as operational amplifiers, RAM or ROM cells, or various common circuit blocks, such as I/O blocks.

Differential pair parameter "$W_f$" affects the size and the parasitic capacitances and resistances of the differential pair. For example, an increase in differential pair parameter "$W_f$" would increase the width of each NMOS transistor's diffusion area. A wider diffusion area results in wider NMOS transistor source and drain areas, and would thus result in an increase in $C_{JSB}$ and $C_{JDB}$, the NMOS transistor's source-to-bulk and drain-to-bulk parasitic capacitances.

Differential pair parameter "$L_f$" also affects the parasitic capacitances and resistances of a differential pair. For example, the NMOS transistors' parasitic gate resistance, i.e. $R_G$, is inversely proportional to differential pair parameter "$L_f$." Thus, an increase in channel length "$L_f$" results in a decrease in the differential pair's NMOS transistors' parasitic gate resistance, i.e. a decrease in $R_G$.

Differential pair parameter "$N_f$" determines the number of gate fingers connected in parallel in each NMOS transistor in the same active area (i.e. diffusion area) in a differential pair layout. For example, if the value of "$N_f$" were equal to four, two gate fingers would be connected in parallel in each half of each NMOS transistor in a differential pair layout.

Differential pair parameter "Current" determines the width of the metals that connect to the source and drain of each NMOS transistor of a differential pair in a corresponding differential pair layout. The differential pair parameter "Current" also affects $R_{SB}$, the parasitic source-to-bulk resistance, and $R_{DB}$, the parasitic drain-to-bulk resistance.

In the present invention, differential pair parameter "Style" specifies the "layout style" used for each NMOS transistor in a differential pair layout. As discussed above, the parasitics inherent in a specific "layout style" can determine which "layout style" is optimal for certain types of applications. For example, in differential pair parameter Style 1, the effect of "Miller capacitance" is minimized (i.e. the common gate poly does not overlap common drain metal in the NMOS transistor layout) and as such Style 1 is an effective layout style for high frequency, for example RF, applications.

The differential pair parameter "Slice" determines the number of "sub-differential pairs" connected in parallel in a differential pair layout. When differential pair parameter "Slice" divides a differential pair into multiple sub-differential pairs, the resulting sub-differential pairs produce multiple parasitic resistances and capacitances. Thus, the overall parasitic resistances and capacitances of a differential pair are affected, though usually not linearly, by the differential pair parameter "Slice."

Differential pair parameter "Bulk Contact" determines the location of the "bulk" (i.e. substrate) contacts for a differential pair. For example, differential pair parameter "Bulk Contact" can designate "l", "r", "t", or "b", respectively, to indicate bulk contacts on the left side, right side, top, or bottom of each NMOS transistor in a differential pair layout. Differential pair parameter "Bulk Contact" can further designate any combination of "l", "r", "t", or "b" to indicate multiple locations of bulk contacts in a differential pair layout.

In a conventional circuit design cycle, such as the design cycle shown in flowchart 100 in FIG. 1, a designer would not know the values of the differential pair's internal parasitics in the above example until after the parasitics were extracted from the circuit layout in a later step in the design cycle, such as step 108 in FIG. 1. In contrast to the conventional circuit design cycle, the present invention predicts, i.e. has advance knowledge of, the differential pair's internal parasitics before the differential pair layout is generated. Thus, the present invention enables the designer to design a circuit that incorporates a multi-component circuit's internal parasitics prior to multi-component circuit layout generation. In other words, the present invention enables the designer to design a circuit block using knowledge of the values of the parasitics in a multi-component circuit layout, such as a differential pair, differential pair with current source, or current mirror layout, before the multi-component circuit layout is generated.

In step 908, a "predictive" multi-component circuit layout is generated in a layout generator. For example, the layout generator uses multi-component circuit parameters, i.e. "$W_f$," "$L_f$," "$N_f$," "Current," "Style," "Slice," and "Bulk Contact," that were input in the circuit block schematic in step 904 to generate a multi-component circuit layout. In other words, the layout generator interprets the values of the input multi-component circuit parameters and builds a layout representation of the multi-component circuit.

By way of example, in step 908, the present invention uses the differential pair multi-component circuit parameters discussed above to generate a differential pair layout. According to the present invention, the differential pair layout generated in step 908 to results in parasitic resistors $R_G$ 504, $R_S$ 512, $R_{SB}$ 520, $R_{DSB}$ 528, $R_{DB}$ 524, $R_D$ 534, and parasitic capacitors $C_{JSB}$ 516 and $C_{JDB}$ 530 (all shown in FIG. 5) for each NMOS transistor that were already used in step 906 to perform circuit simulation. In other words, the differential pair layout generated in step 908 utilizes parameters such as $W_f$ 220, $L_f$ 222, $N_f$ 224, Current 226, Style 228, Slice 230, and Bulk Contact 232 (all shown in FIG. 2) that were inputted by the designer at step 904. The utilization of these parameters, i.e. $W_f$ 220, $L_f$ 222, $N_f$ 224, Current 226, Style 228, Slice 230, and Bulk Contact 232, would then result in a layout having the same parasitic values for resistors $R_G$ 504, $R_S$ 512, $R_{SB}$ 520, $R_{DSB}$ 528, $R_{DB}$ 524, $R_D$ 534, and capacitors $C_{JSB}$ 516 and $C_{JDB}$ 530 for each NMOS transistor in the differential pair as the parasitic values that were used during circuit simulation in step 906.

Thus, according to the present invention, the layout generated at step 908 has, in effect, resulted in advance knowledge of the values of the internal parasitic resistors and capacitors of each NMOS transistor that forms the differential pair. As such, the values of the internal parasitic resistors and capacitors of the differential pair have been accurately predicted and utilized during circuit simulation. Thus, according to the present invention, there is no need for an extraction of the values of the internal parasitic resistors and capacitors of an already laid out differential pair. Further, there is generally no need to re-simulate the circuit with extracted values of the differential pair internal parasitic resistors and capacitors. In other words, the simulation performed at step 906 has already taken into account accurate values of internal parasitic resistors and capacitors of the differential pair.

In step 910 in FIG. 9, a design rule check ("DRC") and a layout vs. circuit schematic ("LVS") verification are performed on the circuit block layout generated in step 908. DRC is performed to ensure that the circuit block layout does not violate any manufacturing specifications. For example, the DRC program identifies problems such as "minimum-spacing" violations and "minimum-width" violations. In LVS, the circuit block layout is checked to ensure that the layout is electrically equivalent to the circuit block schematic and accurately represents the parameters input in the circuit block schematic. In other words, checks are employed to ensure that the circuit block layout does in fact represent the same topology specified by the circuit block schematic.

In step 912, interconnect parasitics are extracted from the circuit block layout. The interconnect parasitics extracted in step 912 do not include parasitics that are internal to the differential pair since the differential pair internal parasitics are already accurately known according to the present invention as described above. The parasitics that are extracted in step 912 are those parasitics that are generated by interconnect routing between the differential pair and other circuit block components. In an embodiment of the present invention, a commercial extraction tool, such as xCalibre®, is used for interconnect parasitic extraction. The commercial extraction tool is instructed to treat the differential pair as a "black box" and not extract any parasitics inside the "black box." In other words, the commercial extraction tool only extracts parasitics that are generated by interconnect routing between the "black box," i.e. the differential pair, and other circuit block components. The parasitics inside the differential pair multi-component circuit can be ignored in step 912 because the differential pair's internal parasitics were accurately predicted and utilized in the circuit simulation step 906.

Since much fewer parasitics have to be considered, post-layout simulation of a circuit block comprising a multi-component circuit, such as the differential pair discussed above, in the present invention is much faster and more predictable than post-layout simulation of the same circuit block in a conventional design system. In other words, during post-layout simulation of a circuit block comprising multi-component circuits in the present invention, only the extracted interconnect parasitics must be taken into account. Thus, the present invention accommodates circuit block design and layout generally in a single pass or, at worst case, without many circuit block design, simulation, and layout generation cycles, as required by conventional design systems.

It is noted that post-layout simulation of a circuit block comprising multi-component circuits, such as differential pairs, differential pairs with current sources, and current mirrors, in a conventional design system is quite unpredictable. Thus circuit block modification in a conventional design system can be quite extensive due to the large number of multi-component circuit internal parasitics that are extracted from the circuit block layout. As a result, a conventional design system typically requires many iterations, such as iteration of steps 102, 104, 106, and 108 in FIG. 1, before the circuit block design and layout generation cycles are completed. Thus, by generating an acceptable circuit block layout and without requiring many iterations, the present invention's design system greatly reduces the time-to-market for circuit blocks comprising multi-component circuits, such as differential pairs, differential pairs with current sources, and current mirrors. Moreover, as stated above, the method of the present invention described in the present application applies to predictively generate a layout, and reduce the design cycle, of other types of multi-component circuits such as operational amplifiers, RAM or ROM cells, or various common circuit blocks, such as I/O blocks.

Figure 10:
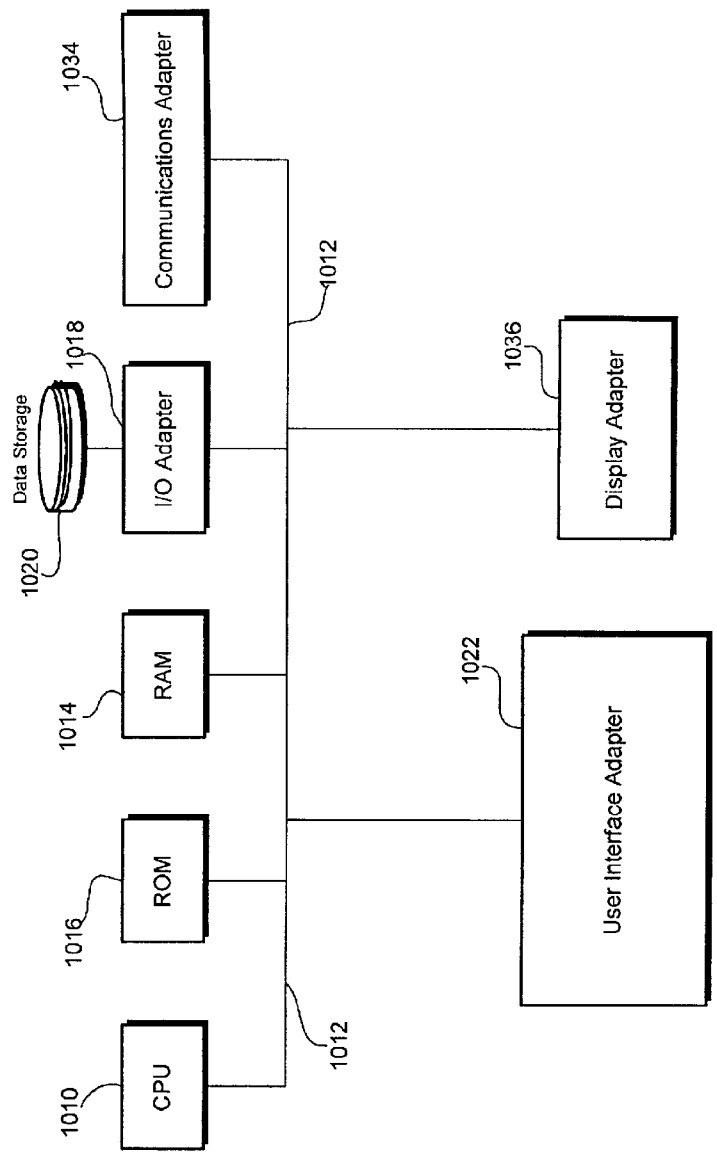
FIG. 10 shows a block diagram of a generic computer which can be utilized to implement an embodiment of the present invention.

By way of example, a typical computer which can be programmed to implement the invention is shown in FIG. 10. The computer programmed to implement the invention is typically part of a system of interconnected computers. Alternatively, the computer shown in FIG. 10 may itself be referred to as a "system" in the present application. The exemplary computer shown in FIG. 10 comprises a Central Processing Unit (CPU) 1010, a Read Only Memory (ROM) 1016, a Random Access Memory (RAM) 1014, an Input/Output (I/O) Adapter 1018, a disk storage (also called a hard drive) 1020, a communications adapter 1034, a user interface adapter 1022, and a display adapter 1036. Bus 1012 couples CPU 1010, ROM 1016, RAM 1014, I/O Adapter 1018, communications adapter 1034, user interface adapter 1022, and display adapter 1036 as shown in FIG. 10. User interface adapter 1022 is typically coupled to an input device such as a keyboard (not shown in FIG. 10) to permit a user to communicate with and control the computer. Display adapter 1036 is typically coupled to a monitor (not shown in FIG. 10) for the purpose of communicating and interacting with the user. By way of a more specific example, the computer shown in FIG. 10 may be a computer system such as HP® 9000 or Sun Solaris® workstation which uses a 32-bit RISC type CPU as CPU 1010. However, it is understood and appreciated by those skilled in the art that the invention may also be implemented using a variety of different types of computers other than those specifically mentioned in the present application.

It is appreciated by the above detailed description that the invention provides method and system for predictive multi-component circuit layout generation with reduced design cycle. The invention provides an integrated design system that is able to predict the size and effect of a multi-component circuit's internal parasitics and thereby use that knowledge to minimize undesirable repetition of steps in the circuit design system.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest from the above description that NMOS transistor subcircuit model 500 can include a greater number or a fewer number of parasitic resistors and capacitors, or may contain other parasitic elements, such as inductors. Moreover, the NMOS transistor subcircuit model can have a different circuit topology than that shown in FIG. 5. Also, the NMOS transistor subcircuit model may include other parasitic elements, such as inductors. Thus, the exact configuration of NMOS transistor subcircuit model may be different from that shown in FIG. 5. However, any differences are a matter of design choice and the invention's principles disclosed herein can be manifestly applied to any NMOS transistor subcircuit model of choice. Moreover, although the invention has been described by reference to multi-component circuits that comprise NMOS transistors, it is manifest to one of ordinary skill in the art that the invention applies to multi-component circuits that employ MOSFETs, such as multi-component circuits.

The described embodiments are to be considered in all respects as illustrative and not restrictive. It should also be understood that the invention is not limited to the particular embodiments described herein, but is capable of many rearrangements, modifications, and substitutions without departing from the scope of the invention. For example, although the various embodiments of the invention described above were specifically directed to multi-component circuits such as a differential pair, a differential pair with current source, and a current mirror, the invention applies generally to predictively generate a layout, and reduce the design cycle, of other types of multi-component circuits such as operational amplifiers, RAM or ROM cells, or various common circuit blocks, such as I/O blocks. However, in order to preserve brevity, the multitude of other types of multi-component circuits to which the present invention applies were not specifically discussed in the present application.

Thus, method and system for predictive multi-component circuit layout generation with reduced design cycle have been described.

What is claimed is:

1. A method comprising steps of:
   receiving a plurality of parameter values for a multi-component circuit having at least one subcircuit model, said plurality of parameter values comprising at least a slice parameter value, said plurality of parameter values determining a plurality of parasitic values of said multi-component circuit;
   generating a layout of said multi-component circuit utilizing said plurality of parameter values, said layout causing said multi-component circuit to have said plurality of parasitic values.

2. The method of claim 1 further comprising a step of utilizing said plurality of parasitic values to simulate an electrical behavior of said multi-component circuit prior to said generating step.

3. The method of claim 1 wherein said plurality of parameter values comprise a style parameter value.

4. The method of claim 3 wherein said style parameter value determines how interconnect lines are routed in said layout of said multi-component circuit.

5. The method of claim 1 wherein said plurality of parameter values comprises a bulk contact parameter value.

6. The method of claim 5 wherein said bulk contact parameter value determines a location for bulk contacts in said layout of said multi-component circuit.

7. The method of claim 1 wherein said plurality of parameter values further comprise finger width, finger length, number of fingers, current, style, and bulk contact parameter values.

8. The method of claim 1 wherein said parasitic values of said at least one subcircuit model comprise a plurality of parasitic resistor values and a plurality of parasitic capacitor values.

9. The method of claim 8 wherein said plurality of parasitic resistor values and said plurality of parasitic capacitor values are determined by said plurality of parameter values.

10. The method of claim 8 further comprising a step of utilizing said plurality of resistor values and said plurality of capacitor values to simulate an electrical behavior of said multi-component circuit prior to said generating step.

11. A method for designing a circuit block including at least one multi-component circuit, said multi-component circuit having at least one subcircuit model, said method comprising steps of:
receiving a plurality of parameter values for said at least one multi-component circuit, said plurality of parameter values comprising at least a slice parameter value;
determining a plurality of parasitic values for said at least one multi-component circuit;
simulating an electrical behavior of said circuit block utilizing said plurality of parasitic values;
generating a layout of said circuit block including said at least one multi-component circuit, said layout causing said at least one multi-component circuit to have said plurality of parasitic values.

12. The method of claim 11 further comprising a step of performing a design rule check after said step of generating said layout.

13. The method of claim 11 further comprising a step of performing a layout versus schematic verification after said step of generating said layout.

14. The method of claim 11 further comprising a step of extracting interconnect parasitics after said step of generating said layout.

15. The method of claim 11 wherein said plurality of parameter values comprise a style parameter value.

16. The method of claim 15 wherein said style parameter value determines how interconnect lines are routed in said layout of said at least one multi-component circuit.

17. The method of claim 11 wherein said plurality of parameter values comprises a bulk contact parameter value.

18. The method of claim 17 wherein said bulk contact parameter value determines a location for bulk contacts in said layout of said at least one multi-component circuit.

19. The method of claim 11 wherein each of said plurality of parameter values further comprise finger width, finger length, number of fingers, current, style, and bulk contact parameter values.

20. The method of claim 11 wherein said parasitic values of said at least one subcircuit model comprise a plurality of parasitic resistor values and a plurality of parasitic capacitor values.

21. The method of claim 20 wherein said plurality of parasitic resistor values and said plurality of parasitic capacitor values are determined by said plurality of parameter values.

22. The method of claim 20 further comprising a step of utilizing said plurality of resistor values and said plurality of capacitor values to simulate an electrical behavior of said at least one multi-component circuit prior to said step of generating said layout.

23. A system comprising a computer for designing a circuit block including at least one multi-component circuit, said at least one multi-component circuit having at least one subcircuit model, said computer implementing a method comprising steps of:
said computer receiving a plurality of parameter values for said at least one multi-component circuit in said circuit block, said plurality of parameter values comprising at least a slice parameter value;
said computer determining a plurality of parasitic values for said at least one multi-component circuit;
said computer generating a layout of said at least one multi-component circuit utilizing said plurality of parameter values, said layout causing said at least one multi-component circuit to have said plurality of parasitic values.

24. The system of claim 23 wherein said method further comprises a step of said computer utilizing said plurality of parasitic values to simulate an electrical behavior of said at least one multi-component circuit prior to said step of said computer generating said layout.

25. The system of claim 23 wherein said method further comprises a step of said computer performing a design rule check after said step of said computer generating said layout.

26. The system of claim 23 wherein said method further comprises a step of said computer performing a layout versus schematic verification after said step of said computer generating said layout.

27. The system of claim 23 wherein said method further comprises a step of said computer extracting interconnect parasitics after said step of said computer generating said layout.

28. The system of claim 23 wherein said plurality of parameter values comprise a style parameter value.

29. The system of claim 28 wherein said style parameter value determines how interconnected lines are routed in said layout of said at least one multi-component circuit.

30. The system of claim 23 wherein said plurality of parameter values comprises a bulk contact parameter value.

31. The system of claim 30 wherein said bulk contact parameter value determines a location for bulk contacts in said layout of said at least one multi-component circuit.

32. The system of claim 23 wherein said plurality of parameter values further comprise finger width, finger length, number of fingers, current, style, and bulk contact parameter values.

33. The system of claim 23 wherein said parasitic values of said at least one subcircuit model comprise a plurality of parasitic resistor values and a plurality of parasitic capacitor values.

34. The system of claim 33 wherein said plurality of parasitic resistor values and said plurality of parasitic capacitor values are determined by said plurality of parameter values.

* * * * *